US012640193B2

(12) United States Patent
Dhori et al.

(10) Patent No.: US 12,640,193 B2
(45) Date of Patent: May 26, 2026

(54) BIT LINE VOLTAGE CLAMPING READ CIRCUIT FOR AN IN- MEMORY COMPUTE OPERATION WHERE SIMULTANEOUS ACCESS IS MADE TO PLURAL ROWS OF A STATIC RANDOM ACCESS MEMORY (SRAM)

(71) Applicant: STMicroelectronics International N.V., Geneva (CH)

(72) Inventors: Kedar Janardan Dhori, Ghaziabad (IN); Harsh Rawat, Faridabad (IN); Promod Kumar, Greater Noida (IN); Nitin Chawla, Noida (IN); Manuj Ayodhyawasi, Noida (IN)

(73) Assignee: STMicroelectronics International N.V., Geneva (CH)

( * ) Notice: Subject to any disclaimer, the term of this patent is extended or adjusted under 35 U.S.C. 154(b) by 278 days.

(21) Appl. No.: 18/137,191

(22) Filed: Apr. 20, 2023

(65) Prior Publication Data

US 2023/0386566 A1 Nov. 30, 2023

Related U.S. Application Data

(60) Provisional application No. 63/345,518, filed on May 25, 2022.

(51) Int. Cl.
*G11C 11/419* (2006.01)
*G06J 1/00* (2006.01)
(Continued)

(52) U.S. Cl.
CPC .......... *G11C 11/419* (2013.01); *G11C 11/412* (2013.01); *G11C 11/418* (2013.01); *H03M 1/46* (2013.01)

(58) Field of Classification Search
CPC ... G11C 11/419; G11C 11/412; G11C 11/418; G11C 7/04; G11C 8/08; G11C 5/147; G11C 7/1006; H03M 1/46; G06J 1/00
See application file for complete search history.

(56) References Cited

U.S. PATENT DOCUMENTS 5,508,966 A     4/1996  Nakase
6,469,929 B1   10/2002  Kushnarenko et al.
(Continued)

FOREIGN PATENT DOCUMENTS

CN          112071344 A    12/2020

OTHER PUBLICATIONS

EPO Search Report and Written Opinion for counterpart EP Appl. No. 23174861, report dated Nov. 10, 2023, 14 pgs.
(Continued)

*Primary Examiner* — Sultana Begum
*Assistant Examiner* — Elizabeth Rose Agger
(74) *Attorney, Agent, or Firm* — Crowe & Dunlevy LLC

(57) ABSTRACT

An in-memory computation circuit includes a memory array with SRAM cells connected in rows by word lines and in columns by bit lines. A row controller circuit simultaneously actuates word lines in parallel for an in-memory compute operation. A column processing circuit includes a clamping circuit that clamps a voltage on the bit line to a level exceeding an SRAM cell bit flip voltage during execution of the in-memory compute operation. The column processing circuit may further include a current mirroring circuit that mirrors the read current developed on each bit line in response to the simultaneous actuation to generate a decision output for the in-memory compute operation. The mirrored read current is integrated by an integration capacitor to generate an output voltage that is converted to a digital signal by an analog-to-digital converter circuit.

16 Claims, 12 Drawing Sheets

(51) Int. Cl.

| | |
|---|---|
| *G11C 5/14* | (2006.01) |
| *G11C 7/04* | (2006.01) |
| *G11C 7/10* | (2006.01) |
| *G11C 8/08* | (2006.01) |
| *G11C 11/412* | (2006.01) |
| *G11C 11/418* | (2006.01) |
| *H03M 1/46* | (2006.01) |

(56) References Cited

U.S. PATENT DOCUMENTS

| | | | | |
|---|---|---|---|---|
| 6,509,595 | B1 * | 1/2003 | Leung | G11C 11/4085 |
| | | | | 257/296 |
| 7,061,793 | B2 | 6/2006 | Barth, Jr. et al. | |
| 7,443,757 | B2 | 10/2008 | Cernea et al. | |
| 8,848,426 | B2 | 9/2014 | Azuma et al. | |
| 9,001,588 | B2 | 4/2015 | Kim et al. | |
| 9,368,224 | B2 | 6/2016 | Wang et al. | |
| 9,502,088 | B2 | 11/2016 | Jung et al. | |
| 9,665,113 | B2 | 5/2017 | Ciubotaru | |
| 11,043,259 | B2 | 6/2021 | Wentzlaff et al. | |
| 2010/0149887 | A1 * | 6/2010 | Takeda | G11C 5/147 |
| | | | | 365/189.16 |
| 2016/0189769 | A1 * | 6/2016 | Jeloka | G11C 15/04 |
| | | | | 365/154 |
| 2017/0301396 | A1 | 10/2017 | Dhori et al. | |
| 2019/0102359 | A1 * | 4/2019 | Knag | G11C 11/418 |
| 2020/0227098 | A1 | 7/2020 | Noel et al. | |
| 2021/0294573 | A1 | 9/2021 | Morie | |
| 2022/0028444 | A1 | 1/2022 | Papageorgiou et al. | |
| 2022/0051717 | A1 * | 2/2022 | Lee | G11C 11/54 |
| 2022/0068400 | A1 | 3/2022 | Pasotti et al. | |
| 2023/0131308 | A1 | 4/2023 | Lee et al. | |

OTHER PUBLICATIONS

X. Si , "24.5 A Twin-8T SRAM Computation-In-Memory Macro for Multiple-Bit CNN-Based Machine Learning," IEEE International Solid-State Circuits Conference (ISSCC), 2019.

Area-Efficient and Variation-Tolerant In-Memory BNN Computing using 6T SRAM Array , Symposium on Circuits VLSI 2019.

K-SRAM: Enabling In-Memory Boolean Computations in CMOS Static Random Access Memories , IEEE Transactions on Circuits and Systems-I: Regular Papers, vol. 65, No. 12, Dec. 2018.

M. Kang et al., "A Multi-Functional In-Memory Inference Processor Using a Standard 6T SRAM Array," IEEE Journal of Solid-State Circuits, vol. 53, No. 2, 2018.

J. Zhang et al., "In-memory computation of a machine-learning classifier in a standard 6T Sram array," IEEE Journal of Solid-State Circuits, vol. 52, No. 4, 2017.

A. Biswas and A. P. Chandrakasan, "CONV-SRAM: An Energy-Efficient SRAM with In-Memory Dot-Product Computation for Low-Power Convolutional Neural Networks," IEEE Journal of Solid-State Circuits (JSSC), vol. 54, No. 1, 2019.

X. Si et al., "A 28nm 64Kb 6T SRAM Computing-in-Memory Macro with 8b MAC Operation for AI Edge Chips," IEEE International Solid-State Circuits Conference (ISSCC), 2020.

J.-W. Su et al., "A 28nm 64Kb Inference-Training Two-Way Transpose Multibit 6T SRAM Compute-in-Memory Macro for AI Edge Chips," IEEE International Solid-State Circuits Conference (ISSCC), 2020.

S. Yin et al., "XNOR-SRAM: In-Memory Computing SRAM Macro for Binary/Ternary Deep Neural Networks," IEEE Journal of Solid-State Circuits (JSSC), vol. 55, No. 6, 2020.

H. Jia et al., "A Programmable Heterogeneous Microprocessor Based on Bit-Scalable In-Memory Computing," in IEEE Journal of Solid-State Circuits, vol. 55, No. 9, 2020.

Z. Jiang et al., "C3SRAM: An In-Memory-Computing SRAM Macro Based on Robust Capacitive Coupling Computing Mechanism," IEEE Journal of Solid-State Circuits (JSSC), vol. 55, No. 7, 2020.

H. Valavi et al., "A 64-Tile 2.4-Mb In-Memory-Computing CNN Accelerator Employing Charge-Domain Compute," IEEE Journal of Solid-State Circuits, vol. 54, No. 6, 2019.

Q. Dong , "A 351TOPS/W and 372.4GOPS Compute-in-Memory SRAM Macro in 7nm FinFET CMOS for Machine-Learning Applications," IEEE International Solid-State Circuits Conference (ISSCC), 2020.

Jaisawal, Akhilesh, et al: "8T SRAM Cell as a Multibit Dot-Product Engine for Beyond Von Neumann Computing," IEEE Transactions on Very Large Scale Integration (VLSI) Systems, vol. 27, No. 11, Nov. 2019, 12 pages.

EPO Extended Search Report for counterpart EP Appl. No. 23174860, report dated Mar. 19, 2024, 14 pgs.

* cited by examiner

BIT LINE VOLTAGE CLAMPING READ CIRCUIT FOR AN IN- MEMORY COMPUTE OPERATION WHERE SIMULTANEOUS ACCESS IS MADE TO PLURAL ROWS OF A STATIC RANDOM ACCESS MEMORY (SRAM)

CROSS REFERENCE TO RELATED APPLICATIONS

This application claims priority to United States Provisional Application for Patent No. 63/345,518, filed May 25, 2022, the disclosure of which is incorporated herein by reference.

TECHNICAL FIELD

Embodiments relate to an in-memory computation circuit utilizing a static random access memory (SRAM) array and, in particular, to a read circuit that clamps bit line voltage during a simultaneous access of multiple rows of the SRAM array for an in-memory compute operation.

BACKGROUND

Reference is made to FIG. 1 which shows a schematic diagram of an in-memory computation circuit 10. The circuit 10 utilizes a static random access memory (SRAM) array 12 formed by standard 6T SRAM memory cells 14 arranged in a matrix format having N rows and M columns. As an alternative, a standard 8T memory cell or an SRAM with a similar functionality and topology could instead be used. Each memory cell 14 is programmed to store a bit of a computational weight or kernel data for an in-memory compute operation. In this context, the in-memory compute operation is understood to be a form of a high dimensional Matrix Vector Multiplication (MVM) supporting multi-bit weights that are stored in multiple bit cells of the memory. The group of bit cells (in the case of a multibit weight) can be considered as a virtual synaptic element. Each bit of the computational weight has either a logic "1" or a logic "0" value.

Each SRAM cell 14 includes a word line WL and a pair of complementary bit lines BLT and BLC. The 8T-type SRAM cell would additionally include a read word line RWL and a read bit line BLR. The cells 14 in a common row of the matrix are connected to each other through a common word line WL (and through the common read word line RWL in the 8T-type implementation). The cells 14 in a common column of the matrix are connected to each other through a common pair of complementary bit lines BLT and BLC (and through the common read bit line BLR in the 8T-type implementation). Each word line WL, RWL is driven by a word line driver circuit 16 which may be implemented as a CMOS driver circuit (for example, a series connected p-channel and n-channel MOSFET transistor pair forming a logic inverter circuit). The word line signals applied to the word lines, and driven by the word line driver circuits 16, are generated from feature data input to the in-memory computation circuit 10 and controlled by a row controller circuit 18. A column processing circuit 20 senses the analog current signals on the pairs of complementary bit lines BLT and BLC (and/or on the read bit line BLR) for the M columns and generates a decision output for the in-memory compute operation from those analog current signals. The column processing circuit 20 can be implemented to support processing where the analog current signals on the columns are first processed individually and then followed by a recombination of multiple column outputs.

Although not explicitly shown in FIG. 1, it will be understood that the circuit 10 further includes conventional row decode, column decode, and read-write circuits known to those skilled in the art for use in connection with writing bits of the computational weight to, and reading bits of the computational weight from, the SRAM cells 14 of the memory array 12.

With reference now to FIG. 2, each memory cell 14 includes two cross-coupled CMOS inverters 22 and 24, each inverter including a series connected p-channel and n-channel MOSFET transistor pair. The inputs and outputs of the inverters 22 and 24 are coupled to form a latch circuit having a true data storage node QT and a complement data storage node QC which store complementary logic states of the stored data bit. The cell 14 further includes two transfer (passgate) transistors 26 and 28 whose gate terminals are driven by a word line WL. The source-drain path of transistor 26 is connected between the true data storage node QT and a node associated with a true bit line BLT. The source-drain path of transistor 28 is connected between the complement data storage node QC and a node associated with a complement bit line BLC. The source terminals of the p-channel transistors 30 and 32 in each inverter 22 and 24 are coupled to receive a high supply voltage (for example, Vdd) at a high supply node, while the source terminals of the n-channel transistors 34 and 36 in each inverter 22 and 24 are coupled to receive a low supply voltage (for example, ground (Gnd) reference) at a low supply node. While FIG. 2 is specific to the use of 6T-type cells, those skilled in the art recognize that the 8T-type cell is similarly configured and would further include a signal path that is coupled to one of the storage nodes and includes a transfer (passgate) transistor coupled to the read bit line BLR and gate driven by the signal on the read word line RWL. The word line driver circuit 16 is also typically coupled to receive the high supply voltage (Vdd) at the high supply node and is referenced to the low supply voltage (Gnd) at the low supply node.

The row controller circuit 18 performs the function of selecting which ones of the word lines WL<0> to WL<N−1> are to be simultaneously accessed (or actuated) in parallel during an in-memory compute operation, and further functions to control application of pulsed signals to the word lines in accordance with the feature data for that in-memory compute operation. FIG. 1 illustrates, by way of example only, the simultaneous actuation of all N word lines with the pulsed word line signals, it being understood that in-memory compute operations may instead utilize a simultaneous actuation of fewer than all rows of the SRAM array. The analog signals on a given pair of complementary bit lines BLT and BLC (or on the read bit line RBL in the 8T-type implementation) are dependent on the logic state of the bits of the computational weight stored in the memory cells 14 of the corresponding column and the width(s) of the pulsed word line signals applied to those memory cells 14.

The implementation illustrated in FIG. 1 shows an example in the form of a pulse width modulation (PWM) for the applied word line signals for the in-memory compute operation. The use of PWM or period pulse modulation (PTM) for the applied word line signals is a common technique used for the in-memory compute operation based on the linearity of the vector for the multiply-accumulation (MAC) operation. The pulsed word line signal format can be further evolved as an encoded pulse train to manage block sparsity of the feature data of the in-memory compute operation. It is accordingly recognized that an arbitrary set of encoding schemes for the applied word line signals can be used when simultaneously driving multiple word lines. Furthermore, in a simpler implementation, it will be understood that all applied word line signals in the simultaneous actuation may instead have a same pulse width.

FIG. 3 is a timing diagram showing simultaneous application of the example pulse width modulated word line signals to plural rows of memory cells 14 in the SRAM array 12 for a given in-memory compute operation, and the development over time of voltages Va,T and Va,C on one corresponding pair of complementary bit lines BLT and BLC, respectively, in response to sinking of cell read current ($I_R$) due to the pulse width(s) of those word line signals and the logic state of the bits of the computational weight stored in the memory cells 14. The representation of the voltage Va levels as shown is just an example. After completion of the computation cycle of the in-memory compute operation, the voltage Va levels return to the bit line precharge Vdd level. It will be noted that a risk exists that the voltage on at least one of the bit lines BLT and BLC may fall from the Vdd voltage to a level below the write margin where an unwanted data flip occurs with respect to the stored data bit value in one of the memory cells 14 of the column. For example, a logic "1" state stored in the cell 14 of a column may be flipped to a logic "0" state. This data flip introduces a data error in the computational weight stored in the memory cells, thus jeopardizing the accuracy of subsequent in-memory compute operations.

The unwanted data flip that occurs due to an excess of bit line voltage lowering is mainly an effect of the simultaneous parallel access of the word lines in matrix vector multiplication mode during the in-memory compute operation. This problem is different from normal data flip of an SRAM bit cell due to Static-Noise-Margin (SNM) issues which happens in serial bit cell access when the bit line is close to the level of the supply voltage Vdd. During serial access, the normal data flip is instead caused by a ground bounce of the data storage nodes QT or QC.

A known solution to address the serial bit cell access SNM failure concern is to lower the word line voltage by a small amount and this is generally achieved by a short circuit of the word line driver and the use of a bleeder path. However, parallel access of multiple word lines during an in-memory compute operation instead needs a Radical-WL Lowering/Modulation (RWLM) technique. Additionally, a known solution to address the foregoing problem is to apply a fixed word line voltage lowering (for example, to apply a voltage $V_{WLUD}$ equal to Vdd/2) on all integrated circuit process corners in order to secure the worst integrated circuit process corner. This word line underdrive (WLUD) solution, however, has a known drawback in that there is a corresponding reduction in cell read current ($I_R$) on the bit lines which can have a negative impact on computation performance. Furthermore, the use of a fixed word line underdrive voltage can increase variability of the read current across the array leading to accuracy loss for the in-memory compute operation.

Another solution is to utilize a specialized bitcell circuit design for each memory cell 14 that is less likely to suffer from an unwanted data flip during simultaneous (parallel) access of multiple rows for the in-memory compute operation. A concern with this solution is an increase in occupied circuit area for such a bitcell circuit. It would be preferred for some in-memory computation circuit applications to retain the advantages provided by use of the standard 6T SRAM cell (FIG. 2) or 8T SRAM cell or topologically similar bit cell in the array 12.

SUMMARY

In an embodiment, an in-memory computation circuit comprises: a memory array including a plurality of static random access memory (SRAM) cells arranged in a matrix with plural rows and plural columns, each row including a word line connected to the SRAM cells of the row, and each column including a first bit line connected to the SRAM cells of the column; a word line driver circuit for each row having an output connected to drive the word line of the row; a row controller circuit configured to simultaneously actuate the plurality of word lines by applying pulses through the word line driver circuits to the word lines for an in-memory compute operation; and a column processing circuit including a first read circuit coupled to each first bit line.

Each first read circuit comprises: a first differential amplifier having a first input coupled to the first bit line, a second input configured to receive a reference voltage (wherein said reference voltage is at a level greater than a bit flip voltage for the SRAM cells during the simultaneous actuation of the plurality of word lines for the in-memory compute operation), and an output; a first MOS transistor having a drain coupled to the first bit line to receive the first read current and a gate coupled to the output of the first differential amplifier; a second MOS transistor having a gate coupled to the output of the first differential amplifier and a drain configured to output a first mirrored read current; and a first integration capacitor configured to integrate the first mirrored read current to generate a first output voltage.

The first differential amplifier and first MOS transistor function to clamp a voltage on the first bit line to said reference voltage.

In an embodiment, an in-memory computation circuit comprises: a memory array including a plurality of static random access memory (SRAM) cells arranged in a matrix with plural rows and first and second columns, each row including a word line connected to the SRAM cells of the row, and each of the first and second columns including a first bit line connected to the SRAM cells of the column; a word line driver circuit for each row having an output connected to drive the word line of the row; a row controller circuit configured to simultaneously actuate the plurality of word lines by applying pulses through the word line driver circuits to the word lines for an in-memory compute operation; and a column processing circuit.

The column processing circuit includes: a first read circuit and a second read circuit. The first read circuit comprises: a first voltage clamp circuit configured to clamp a voltage on the first bit line of the first column to a reference voltage during the simultaneous actuation of the plurality of word lines for the in-memory compute operation; and a first current mirroring circuit connected to said first voltage clamp circuit and coupled to the first bit line of the first column, said first current mirroring circuit having a first current mirroring ratio and configured to mirror a first read current on the first bit line of the first column to generate a first mirrored read current. The second read circuit comprises: a second voltage clamp circuit configured to clamp a voltage on the first bit line of the second column to the reference voltage during the simultaneous actuation of the plurality of word lines for the in-memory compute operation; and a second current mirroring circuit connected to said second voltage clamp circuit and coupled to the first bit line of the second column, said second current mirroring circuit having a second current mirroring ratio and configured to mirror a second read current on the first bit line of the second column to generate a second mirrored read current. A first integration capacitor is configured to integrate a sum of the first and second mirrored read currents to generate a first output voltage.

The reference voltage is at a level greater than a bit flip voltage for the SRAM cells during the simultaneous actuation of the plurality of word lines for the in-memory compute operation.

In an embodiment, an in-memory computation circuit comprises: a memory array including a plurality of 6T static random access memory (SRAM) cells arranged in a matrix with plural rows and plural columns, each row including a word line connected to the SRAM cells of the row, and each column including a first bit line connected to the 6T SRAM cells of the column; a word line driver circuit for each row having an output connected to drive the word line of the row; a row controller circuit configured to simultaneously actuate the plurality of word lines by applying pulses through the word line driver circuits to the word lines for an in-memory compute operation; and a column processing circuit.

The column processing circuit includes a first read circuit coupled to each first bit line, wherein each first read circuit comprises: a first differential amplifier having a first input coupled to the first bit line, a second input configured to receive a reference voltage, and an output; and a first feedback resistor coupled between the output and first input of the first differential amplifier, wherein said output is configured to generate a first output voltage dependent on the reference voltage and a first read current on the first bit line. The first differential amplifier functions to clamp a voltage on the first bit line to said reference voltage, wherein said reference voltage is at a level greater than a bit flip voltage for the SRAM cells during the simultaneous actuation of the plurality of word lines for the in-memory compute operation.

BRIEF DESCRIPTION OF THE DRAWINGS

For a better understanding of the embodiments, reference will now be made by way of example only to the accompanying figures in which.

DETAILED DESCRIPTION OF THE DRAWINGS

Figure 1:
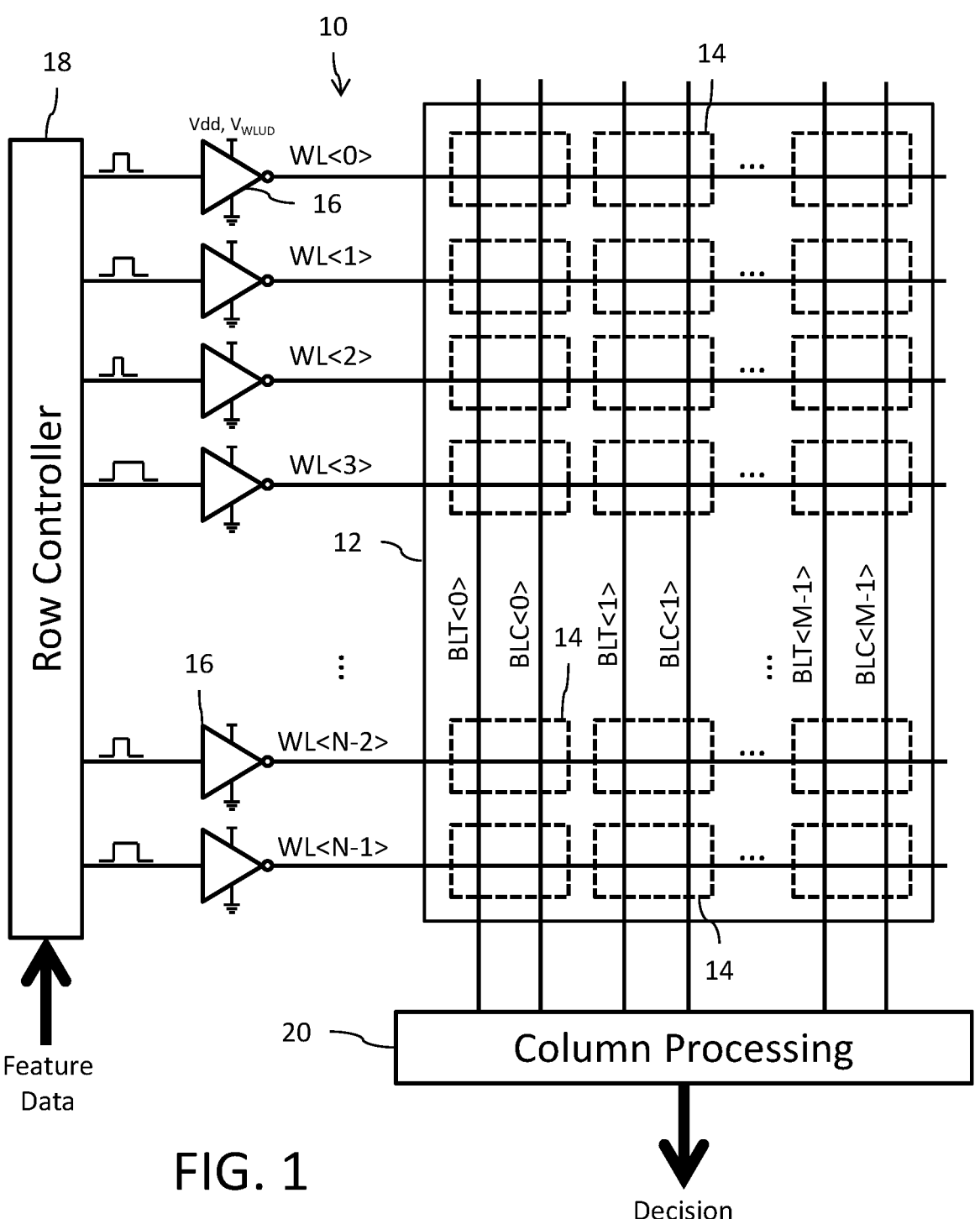
FIG. 1 is a schematic diagram of an in-memory computation circuit.
Figure 2:
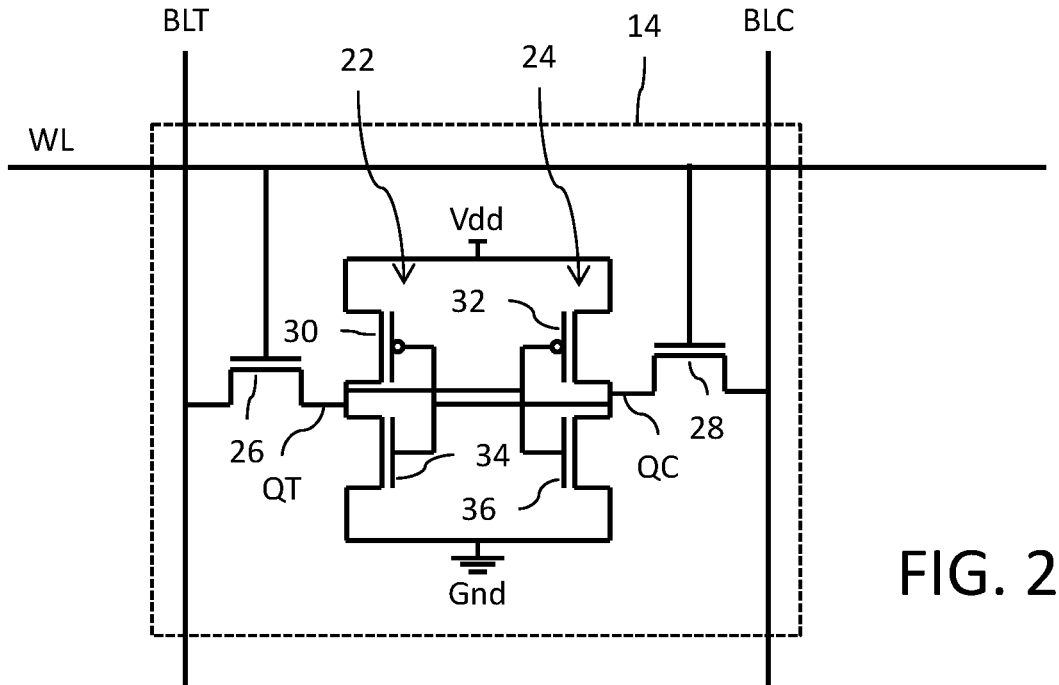
FIG. 2 is a circuit diagram of a standard 6T static random access memory (SRAM) cell as used the memory array of the in-memory computation circuit shown in FIG. 1.
Figure 3:
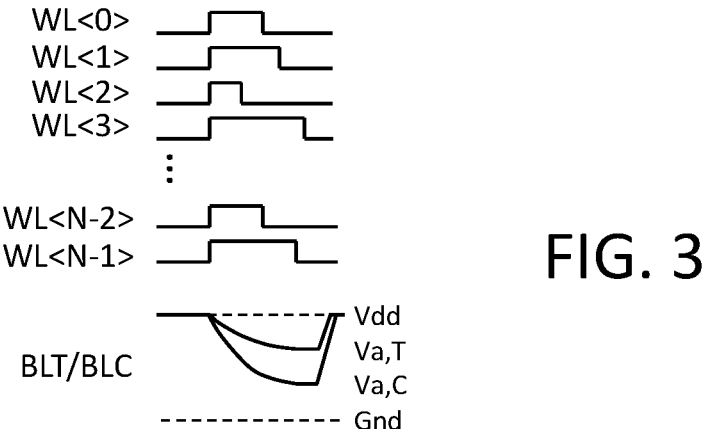
FIG. 3 is a timing diagram illustrating an in-memory compute operation.
Figure 4A:
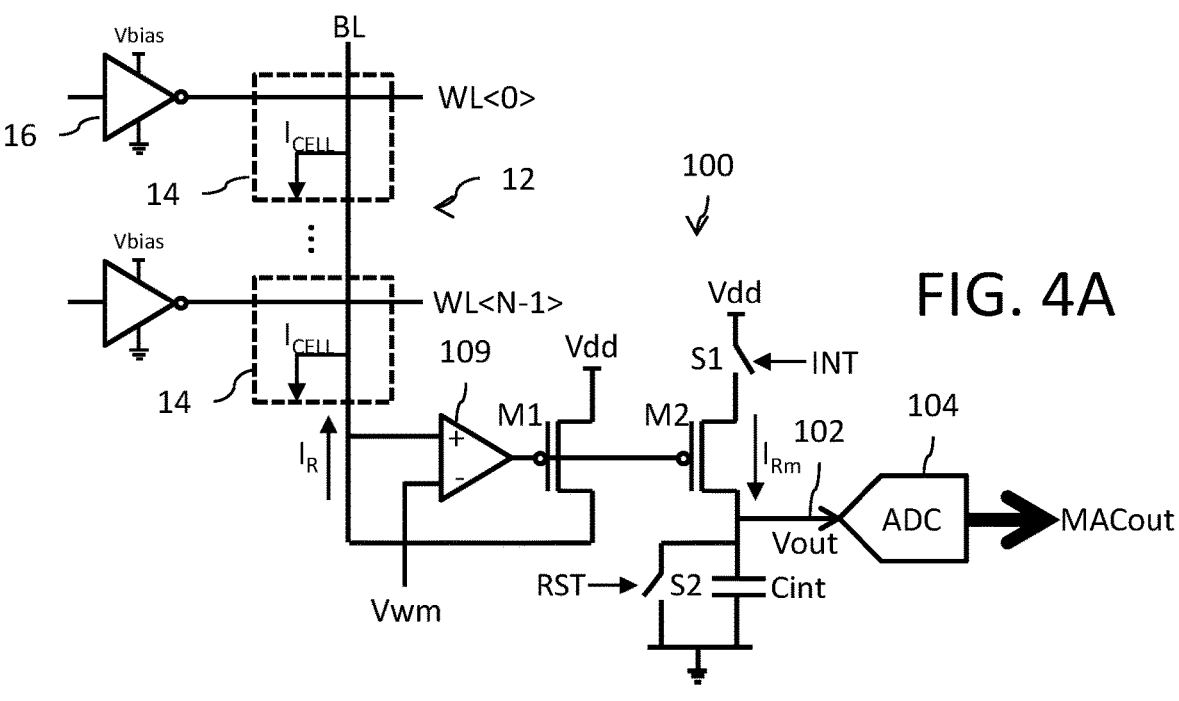
FIGS. 4A and 4B are circuit diagrams for a bit line read circuit.

Reference is now made to FIG. 4A which shows a circuit diagram for a bit line read circuit 100 used within the column processing circuit 20. A bit line BL for a given column of memory cells 14 in the array 12 is coupled, preferably directly connected, to a non-inverting input of a differential amplifier 109 and is coupled, preferably directly connected, to a drain terminal of a p-channel MOS transistor M1. The bit line BL may, for example, comprise any of the complementary bit lines BLT, BLC or the read bit line BLR for a column of the memory. The inverting input of the differential amplifier 109 is coupled to receive a reference voltage Vwm having a voltage level set at greater than the write margin voltage for the memory cells 14. This write margin voltage is the bit line voltage where a risk of inadvertent bit flip in a 6T SRAM cell arises during simultaneous word line access for an in memory compute operation (for example, Vwm equals a voltage at or about Vdd/2). The output of the differential amplifier 109 is coupled, preferably directly connected, to the gate terminal of the p-channel MOS transistor M1 and to the gate terminal of a p-channel MOS transistor M2. The source terminal of the transistor M2 is coupled through a switch S1 to the supply voltage Vdd node. The open/close state of the switch S1 is controlled by the logic state of an integration signal INT. The drain terminal of transistor M2 is coupled, preferably directly connected, to an intermediate node 102. An integration capacitor Cint has a first terminal coupled, preferably directly connected, to the intermediate node 102 and a second terminal coupled, preferably directly connected, to a reference voltage (for example, ground) node. The intermediate node 102 is further coupled through a switch S2 to the reference voltage node. The open/close state of the switch S2 is controlled by the logic state of a reset signal RST.

The switches S1, S2 each may be implemented, for example, using a MOS transistor gate controlled by the appropriate one of the control signals RST and INT.

Figure 4B:
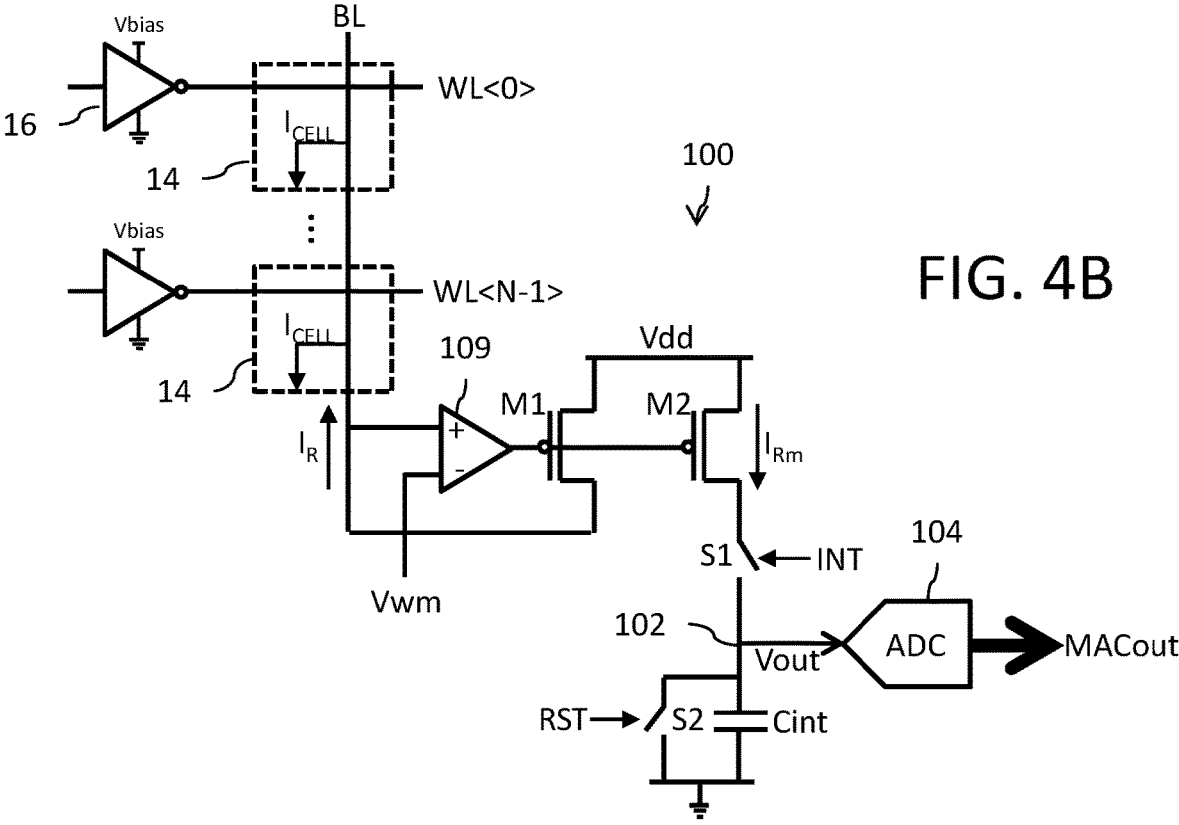

In an alternative embodiment, the switch S1 may be positioned between the drain of transistor M2 and the intermediate node 102 as shown in FIG. 4B. In either case, the transistors M1 and M2 along with switch S1 form a selectively actuatable (in response to control signal INT) current mirror circuit configured to generate a mirrored read current $I_{Rm}$ from the bit line BL read current $I_R$ formed by a sum of the cell currents $I_{CELL}$ of the memory cells 14 in the column during the in-memory compute operation when multiple ones of the word lines WL are simultaneously actuated with word line signal pulses dependent on the received feature data. The mirrored read current $I_{Rm}$ is then applied to charge the integration capacitor Cint and generate an output voltage Vout.

It will be understood that one bit line read circuit 100 is provided in the column processing circuit 20 for each column of the memory.

The intermediate node 102 is further coupled to an input of an analog-to-digital converter (ADC) circuit 104 that operates to convert the analog voltage Vout across the integration capacitor Cint to a digital signal MACout indicative of the result of the MAC operation. One ADC circuit 104 may be provided for each column. Alternatively, one ADC circuit 104 may be shared by multiple columns through a time division multiplexing operation. The digital signals MACout from each column may be output as the Decision from the column processing circuit 20 or combined with each other to generate the Decision.

Operation of the bit line read circuit 100 is as follows: At a beginning of a computation cycle for an in-memory compute operation, the reset signal RST is asserted to close the switch S2 and discharge the integration capacitor Cint. Simultaneous application of word line signals dependent on the received feature data is then made to plural rows of memory cells 14 in the SRAM array 12 for the in-memory compute operation and a read current $I_R$ develops on the bit line BL. The magnitude of the read current $I_R$ is a function of a sum of the currents $I_{CELL}$ sunk to ground by the memory cells 14 of the column which participates in the in-memory compute operation. The integration signal INT is asserted to close the switch S1 and begin the integration time period. The amplifier 109 and transistor M1 function as a voltage clamping circuit configured to prevent the voltage on the bit line BL from falling below the reference voltage Vwm (which is greater than the write margin voltage where there is a risk of inadvertent bit flip). In other words, this circuitry functions to inhibit drop of a voltage on the bit line below a bit flip voltage during the in-memory compute operation when plural word lines are being simultaneously actuated. The transistors M1 and M2 function as a current mirroring circuit and a mirrored read current $I_{Rm}$ is applied to charge the integration capacitor Cint to generate a voltage Vout=$I_{Rm}$*t/C, where t is the duration of the integration time period (when switch S1 is closed) and C is the capacitance of the integration capacitor Cint. When the integration time period expires, the integration signal INT is deasserted to open the switch S1. The voltage Vout across the integration capacitor Cint is then converted to the digital signal MACout by the ADC circuit 104.

Figure 5:
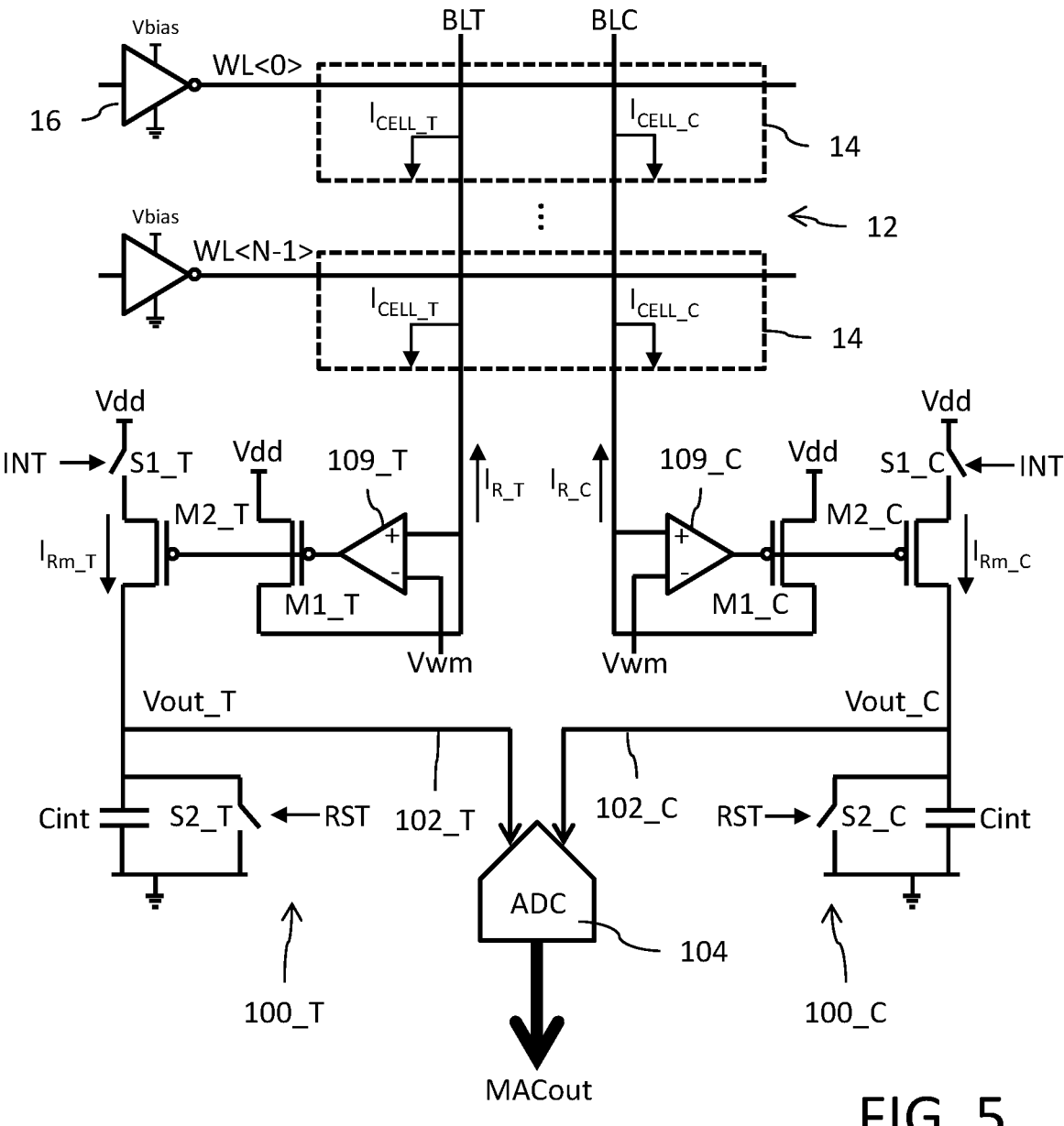
FIG. 5 is a circuit diagram for a differential signaling implementation of the bit line read circuit.

Reference is now made to FIG. 5 which shows a circuit diagram for a differential signaling implementation of the bit line read circuit 100. Like references refer to same or similar components. In this implementation, the currents on the true bit line BLT and the complement bit line BLC are processed by the bit line read circuit 100. The use of the suffix "_T" designates components associated with the processing of the read current on the true bit line BLT, and the use of the suffix "_C" designates components associated with the processing of the read current on the complement bit line BLC. Thus, the bit line read circuit 100 comprises a true read circuit 100_T for processing the read current $I_{R\_T}$ on the true bit line BLT and a complement read circuit 100_C for processing the read current $I_{R\_C}$ on the complement bit line BLC. The circuit configuration for each of the read circuits 100_T, 100_C is the same as shown in FIG. 4A and each circuit operates in the manner described above. The differential signaling implementation in FIG. 5 differs from the implementation of FIGS. 4A-4B in that differential integration voltages Vout_T, Vout_C are generated by the bit line read circuits 100_T, 100_C and the ADC circuit 104 operates to convert a difference between the voltages Vout_T, Vout_C for the digital signal MACout.

With reference now to the true read circuit 100_T, the true bit line BLT for a given column of memory cells 14 in the array 12 is coupled, preferably directly connected, to a non-inverting input of a differential amplifier 109_T and is coupled, preferably directly connected, to a drain terminal of a p-channel MOS transistor M1_T. The source terminal of the transistor M1_T is coupled, preferably directly connected, to a supply voltage Vdd node. The inverting input of the differential amplifier 109 is coupled to receive a reference voltage Vwm having a voltage level set at greater than the write margin voltage for the memory cells 14. This write margin voltage is the bit line voltage where a risk of inadvertent bit flip in a 6T SRAM cell arises during simultaneous word line access for an in memory compute operation (for example, Vwm equals a voltage at or about Vdd/2). The output of the differential amplifier 109_T is coupled, preferably directly connected, to the gate terminal of the p-channel MOS transistor M1_T and to the gate terminal of a p-channel MOS transistor M2_T. The source terminal of the transistor M2_T is coupled through a switch S1_T to the supply voltage Vdd node. The open/close state of the switch S1_T is controlled by the logic state of an integration signal INT. The drain terminal of transistor M2_T is coupled, preferably directly connected, to an intermediate node 102_T. An integration capacitor Cint has a first terminal coupled, preferably directly connected, to the intermediate node 102_T and a second terminal coupled, preferably directly connected, to a reference voltage (for example, ground) node. The intermediate node 102_T is further coupled through a switch S2_T to the reference voltage node. The open/close state of the switch S2_T is controlled by the logic state of a reset signal RST.

For the complement read circuit 100_C, the complement bit line BLC for the given column of memory cells 14 in the array 12 is coupled, preferably directly connected, to a non-inverting input of a differential amplifier 109_C and is coupled, preferably directly connected, to a drain terminal of a p-channel MOS transistor M1_C. The source terminal of the transistor M1_C is coupled, preferably directly connected, to the supply voltage Vdd node. The inverting input of the differential amplifier 109_C is coupled to receive the reference voltage Vwm. The output of the differential amplifier 109_C is coupled, preferably directly connected, to the gate terminal of the p-channel MOS transistor M1_C and to the gate terminal of a p-channel MOS transistor M2_C. The source terminal of the transistor M2_C is coupled through a switch S1_C to the supply voltage Vdd node. The open/close state of the switch S1_C is controlled by the logic state of the integration signal INT. The drain terminal of transistor M2_C is coupled, preferably directly connected, to an intermediate node 102_C. An integration capacitor Cint has a first terminal coupled, preferably directly connected, to the intermediate node 102_C and a second terminal coupled, preferably directly connected, to the reference voltage (for example, ground) node. The intermediate node 102_C is further coupled through a switch S2_C to the reference voltage node. The open/close state of the switch S2_C is controlled by the logic state of a reset signal RST.

The switches S1_T, S1_C, S2_T, S2_C each may be implemented, for example, using a MOS transistor gate controlled by the appropriate one of the control signals RST and INT.

It will be understood that each of the read circuits 100_T, 100_C in of FIG. 5 could alternatively be implemented in the manner shown in FIG. 4B, and in this configuration the switches S1_T, S1_C would instead be positioned between the drain of transistors M2_T, M2_C, respectively, and the intermediate nodes 102_T, 102_C. In either case, the transistors M1_T and M2_T along with switch S1_T, respectively M1_C and M2_C along with switch S1_C, form a selectively actuatable (in response to control signal INT) current mirror circuit configured to generate a mirrored read current $I_{Rm}$ from the bit line BL read current $I_R$ formed by the cell currents $I_{CELL}$ of the memory cells 14 in the column.

The mirrored read current $I_{Rm}$ is then applied to charge the integration capacitor Cint and generate an output voltage Vout.

It will be understood that one pair of bit line read circuits 100_T, 100_C is provided in the column processing circuit 20 for each column of the memory.

The intermediate nodes 102_T, 102_C are further coupled to the differential inputs of an analog-to-digital converter (ADC) circuit 104 that operates to convert a difference between the analog voltages Vout_T, Vout_C to a digital signal MACout indicative of the result of the MAC operation. One ADC circuit 104 may be provided for each column. Alternatively, one ADC circuit 104 may be shared by multiple columns through a time division multiplexing operation. The digital signals MACout from each column may be output as the Decision from the column processing circuit 20 or combined with each other to generate the Decision.

Operation of the bit line read circuit 100 is as follows: At a beginning of a computation cycle for an in-memory compute operation, the reset signal RST is asserted to close the switches S2_T, S2_C and discharge the integration capacitors Cint. Simultaneous application of word line signals dependent on the received feature data is then made to plural rows of memory cells 14 in the SRAM array 12 for the in-memory compute operation and true and complement read currents $I_{R\_T}$, $I_{R\_C}$ develop on the complementary bit lines BLT, BLC. The magnitudes of the read currents $I_{R\_T}$, $I_{R\_C}$ are a function of a sum of the currents $I_{CELL}$ sunk to ground by the memory cells 14 of the column which participates in the in-memory compute operation. The integration signal INT is asserted to close the switches S1_T, S1_C and begin the integration time period. The amplifiers 109_T, 109_C and transistors M1_T, M1_C function as voltage clamping circuits configured to prevent the voltage on each of the complementary bit lines BLT, BLC from falling below the reference voltage Vwm (which is greater than the write margin voltage where there is a risk of inadvertent bit flip). In other words, this circuitry functions to inhibit drop of a voltage on the bit line below a bit flip voltage during the in-memory compute operation when plural word lines are being simultaneously actuated. The transistors M1_T and M2_T, M1_C and M2_C function as current mirroring circuits and corresponding mirrored read currents $I_{Rm\_T}$, $I_{Rm\_C}$ are applied to charge the integration capacitors Cint to generate voltages Vout_T, Vout_C as a function of $I_{Rm\_T}*t/C$, $I_{Rm\_C}*t/C$, where t is the duration of the integration time period (when the switches S1_T and S1_C are closed) and C is the capacitance of the integration capacitor Cint. When the integration time period expires, the integration signal INT is deasserted to open the switches S1_T, S1, C. A difference between the voltages Vout_T, Vout_C across the integration capacitors Cint is then converted to the digital signal MACout by the ADC circuit 104.

Figure 6:
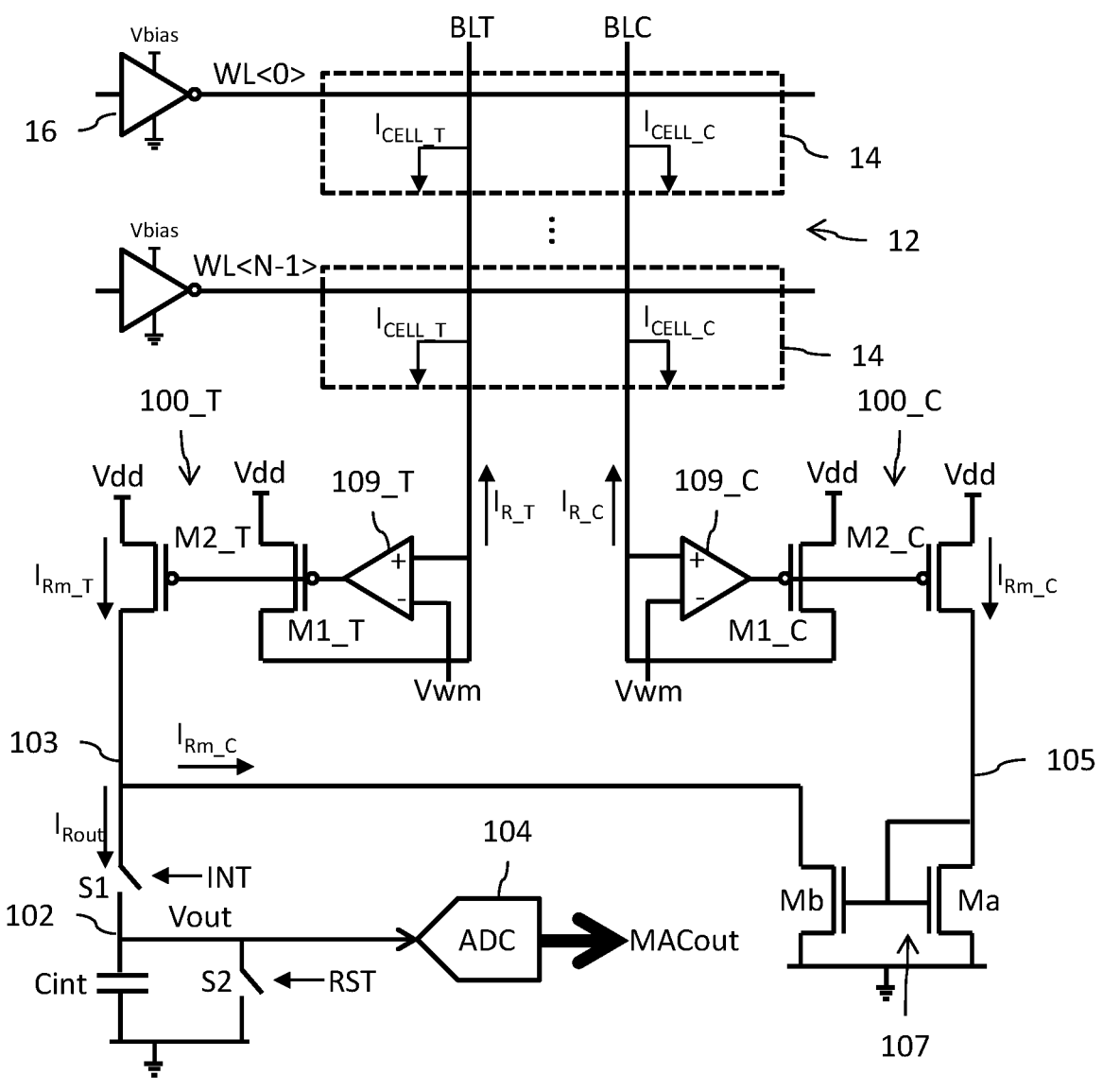
FIG. 6 is a circuit diagram for a single ended signaling implementation of the bit line read circuit.

Reference is now made to FIG. 6 which shows a circuit diagram for a single ended signaling implementation of the bit line read circuit 100. Like references refer to same or similar components. In this implementation, the currents on the true bit line BLT and the complement bit line BLC are processed by the bit line read circuit 100. The use of the suffix "_T" designates components associated with the processing of the read current on the true bit line BLT, and the use of the suffix "_C" designates components associated with the processing of the read current on the complement bit line BLC. Thus, the bit line read circuit 100 comprises a true read circuit 100_T for processing the read current IR_T on the true bit line BLT and a complement read circuit 100_C for processing the read current IR_C on the complement bit line BLC. The configuration of the read circuits 100_T, 100_C is similar to the implementation shown in FIG. 4B and each circuit operates in the manner described above. The single ended signaling implementation in FIG. 6 primarily differs from the differential signaling implementation in FIG. 5 in that a single output voltage Vout is generated from an integration of a difference between the mirrored read currents $I_{Rm\_T}$, $I_{Rm\_C}$, with that output voltage Vout then being converted by the ADC circuit 104 to generate the digital signal MACout.

With reference now to the true read circuit 100_T, the true bit line BLT for a given column of memory cells 14 in the array 12 is coupled, preferably directly connected, to a non-inverting input of a differential amplifier 109_T and is coupled, preferably directly connected, to a drain terminal of a p-channel MOS transistor M1_T. The source terminal of the transistor M1_T is coupled, preferably directly connected, to a supply voltage Vdd node. The inverting input of the differential amplifier 109 is coupled to receive a reference voltage Vwm having a voltage level set at greater than the write margin voltage for the memory cells 14. This write margin voltage is the bit line voltage where a risk of inadvertent bit flip in a 6T SRAM cell arises during simultaneous word line access for an in memory compute operation (for example, Vwm equals a voltage at or about Vdd/2). The output of the differential amplifier 109_T is coupled, preferably directly connected, to the gate terminal of the p-channel MOS transistor M1_T and to the gate terminal of a p-channel MOS transistor M2_T. The source terminal of the transistor M2_T is coupled, preferably directly connected, to the supply voltage Vdd node. The drain terminal of transistor M2_T is coupled, preferably directly connected, to a current summing node 103.

For the complement read circuit 100_C, the complement bit line BLC for the given column of memory cells 14 in the array 12 is coupled, preferably directly connected, to a non-inverting input of a differential amplifier 109_C and is coupled, preferably directly connected, to a drain terminal of a p-channel MOS transistor M1_C. The source terminal of the transistor M1_C is coupled, preferably directly connected, to the supply voltage Vdd node. The inverting input of the differential amplifier 109_C is coupled to receive the reference voltage Vwm. The output of the differential amplifier 109_C is coupled, preferably directly connected, to the gate terminal of the p-channel MOS transistor M1_C and to the gate terminal of a p-channel MOS transistor M2_C. The source terminal of the transistor M2_C is coupled, preferably directly connected, to the supply voltage Vdd node. The drain terminal of transistor M2_C is coupled, preferably directly connected, to a current input node 105 of an n-channel current mirror circuit 107 formed by input transistor Ma and output transistor Mb which share common gate terminals and common source terminals, with the drain and gate of input transistor Ma directly connected at the input node 105. An output of the current mirror circuit 107 at the drain of transistor Mb is coupled, preferably directly connected, to the current summing node 103.

At the current summing node 103, the mirrored read current $I_{Rm\_c}$ from the complement read circuit 100_C is subtracted from the mirrored read current $I_{Rm\_T}$ from the true read circuit 100_T to generate a resulting output read current $I_{Rout}$.

The output read current $I_{Rout}$ from the current summing node 103 is coupled through a switch S1 to an intermediate node 102. The open/close state of the switch S1 is controlled by the logic state of an integration signal INT. An integration capacitor Cint has a first terminal coupled, preferably directly connected, to the intermediate node 102 and a second terminal coupled, preferably directly connected, to the reference voltage (for example, ground) node. The intermediate node 102 is further coupled through a switch S2 to the reference voltage node. The open/close state of the switch S2 is controlled by the logic state of a reset signal RST.

The switches S1, S2 each may be implemented, for example, using a MOS transistor gate controlled by the appropriate one of the control signals RST and INT.

It will be understood that each of the read circuits 100_T, 100_C in of FIG. 6 could alternatively be implemented in the manner shown in FIG. 4A, and in this configuration the switch S1 would instead be implemented by switches S1_T, S1_C positioned between the source of transistors M2_T, M2_C, respectively, and the supply voltage node.

It will be understood that one pair of bit line read circuits 100_T, 100_C is provided in the column processing circuit 20 for each column of the memory.

The intermediate node 102 is further coupled to an input of an analog-to-digital converter (ADC) circuit 104 that operates to convert the analog voltage Vout across the integration capacitor Cint to a digital signal MACout indicative of the result of the MAC operation. One ADC circuit 104 may be provided for each column. Alternatively, one ADC circuit 104 may be shared by multiple columns through a time division multiplexing operation. The digital signals MACout from each column may be output as the Decision from the column processing circuit 20 or combined with each other to generate the Decision.

Operation of the bit line read circuit 100 is as follows: At a beginning of a computation cycle for an in-memory compute operation, the reset signal RST is asserted to close the switch S2 and discharge the integration capacitor Cint. Simultaneous application of word line signals dependent on the received feature data is then made to plural rows of memory cells 14 in the SRAM array 12 for the in-memory compute operation and true and complement read currents $I_{R\_T}$, $I_{R\_C}$ develop on the complementary bit lines BLT, BLC. The magnitudes of the read currents $I_{R\_T}$, $I_{R\_C}$ are a function of a sum of the currents $I_{CELL}$ sunk to ground by the memory cells 14 of the column which participates in the in-memory compute operation. The integration signal INT is asserted to close the switch S1 and begin the integration time period. The amplifiers 109_T, 109_C and transistors M1_T, M1_C function as voltage clamping circuits configured to prevent the voltage on each of the complementary bit lines BLT, BLC from falling below the reference voltage Vwm (which is greater than the write margin voltage where there is a risk of inadvertent bit flip). In other words, this circuitry functions to inhibit drop of a voltage on the bit line below a bit flip voltage during the in-memory compute operation when plural word lines are being simultaneously actuated. The transistors M1_T and M2_T, M1_C and M2_C function as current mirroring circuits and corresponding mirrored read currents $I_{Rm\_T}$, $I_{Rm\_C}$ are applied to the current summing node 103. The mirrored read current $I_{Rm\_C}$ is subtracted from the mirrored read current $I_{Rm\_T}$ and the resulting output read current $I_{Rout}$ is applied to charge the integration capacitor Cint and generate the output voltage Vout as a function of $I_{Rout}$*t/C, where t is the duration of the integration time period (when switch S1 is closed) and C is the capacitance of the integration capacitor Cint. When the integration time period expires, the integration signal INT is deasserted to open the switch S1. The voltage Vout across the integration capacitor Cint is then converted to the digital signal MACout by the ADC circuit 104.

Figure 7A:
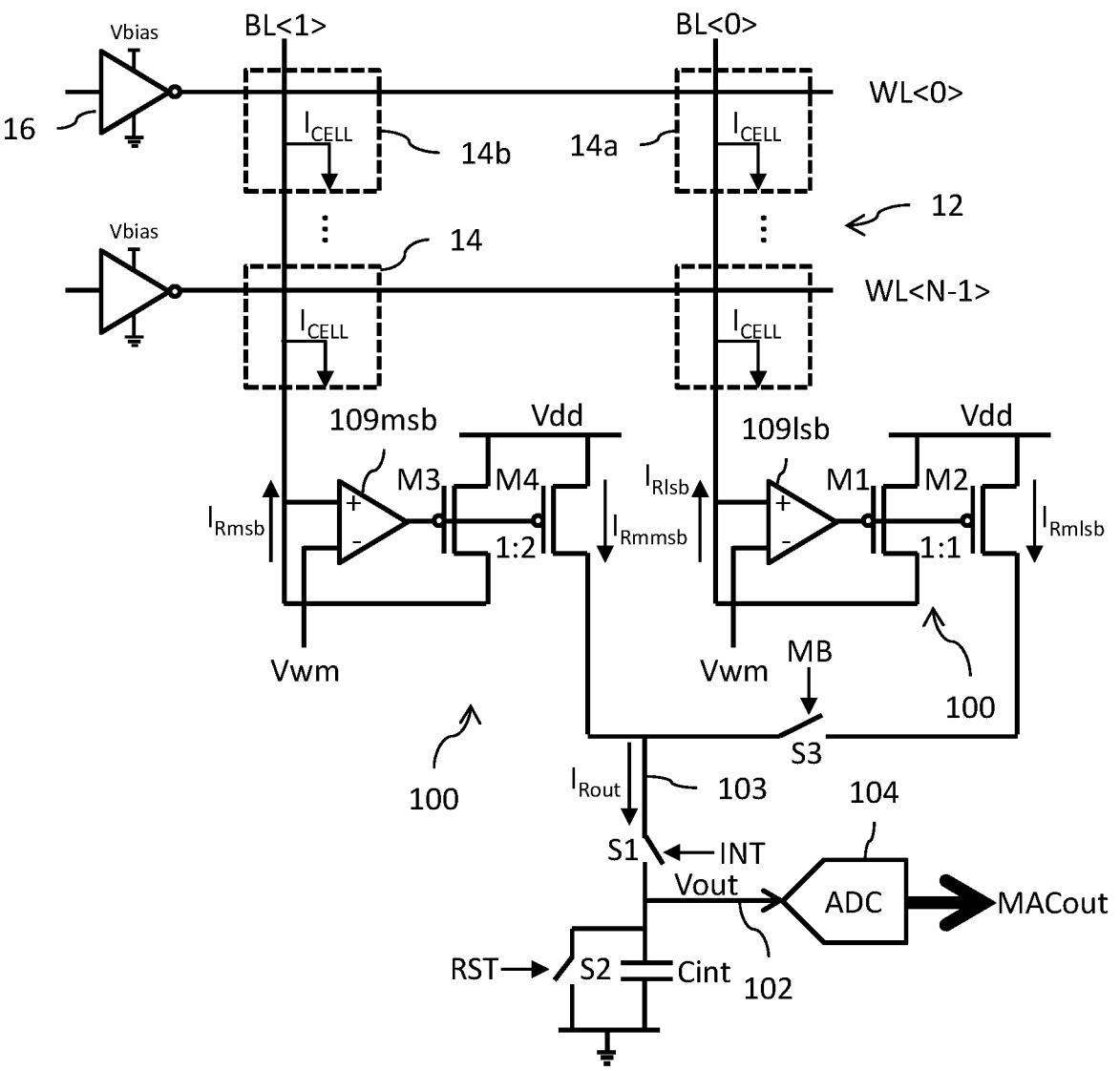
FIGS. 7A and 7B are circuit diagrams for an implementation of the bit line read circuit supporting multibit weight data.

The foregoing implementations illustrate operation for an in-memory compute where single bit weight data is being processed. It will be understood, however, that the foregoing implementations of the read circuit 100 are equally applicable when multibit weight data is being processed. With reference to FIG. 7A (generally corresponding to the implementation of FIG. 4B), an implementation is shown where the weight data includes two bits stored in the memory cells 14a and 14b of two columns in the array associated with bit lines BL<0> and BL<1>. In this example, the less significant bit (lsb) of the weight data is stored in memory cell 14a and the more significant bit (msb) of the weight data is stored in memory cell 14b.

The bit line BL<0> for the less significant bit column of memory cells 14 in the array 12 is coupled, preferably directly connected, to a non-inverting input of a differential amplifier 1091sb and is coupled, preferably directly connected, to a drain terminal of a p-channel MOS transistor M1. The bit line BL<0> may, for example, comprise any of the complementary bit lines BLT, BLC or the read bit line BLR (in the case of an 8T bitcell) for a column of the memory. The inverting input of the differential amplifier 1091sb is coupled to receive a reference voltage Vwm having a voltage level set at greater than the write margin voltage for the memory cells 14. This write margin voltage is the bit line voltage where a risk of inadvertent bit flip in a 6T SRAM cell arises during simultaneous word line access for an in memory compute operation (for example, Vwm equals a voltage at or about Vdd/2). The output of the differential amplifier 1091sb is coupled, preferably directly connected, to the gate terminal of the p-channel MOS transistor M1 and to the gate terminal of a p-channel MOS transistor M2. The source terminal of the transistor M2 is coupled, preferably directly connected, to current summation node 103.

The transistors M1 and M2 and differential amplifier 1091sb form a current mirror circuit with a mirroring ratio of 1:1 that is configured to generate a mirrored read current $I_{Rmlsb}$ from the bit line BL read current $I_{Rlsb}$ formed by the cell currents $I_{CELL}$ of the memory cells 14 in the column (where $I_{Rmlsb} = I_{Rlsb}$).

The bit line BL<1> for the more significant bit column of memory cells 14 in the array 12 is coupled, preferably directly connected, to a non-inverting input of a differential amplifier 109msb and is coupled, preferably directly connected, to a drain terminal of a p-channel MOS transistor M3. The bit line BL<1> may, for example, comprise any of the complementary bit lines BLT, BLC or the read bit line BLR (in the case of an 8T bitcell) for a column of the memory. The inverting input of the differential amplifier 109msb is coupled to receive a reference voltage Vwm having a voltage level set at greater than the write margin voltage for the memory cells 14. This write margin voltage is the bit line voltage where a risk of inadvertent bit flip in a 6T SRAM cell arises during simultaneous word line access for an in memory compute operation (for example, Vwm equals a voltage at or about Vdd/2). The output of the differential amplifier 109msb is coupled, preferably directly connected, to the gate terminal of the p-channel MOS transistor M3 and to the gate terminal of a p-channel MOS transistor M4. The source terminal of the transistor M4 is coupled, preferably directly connected, to the current summation node 103.

The transistors M3 and M4 and differential amplifier 109msb form a current mirror circuit with a mirroring ratio of 2:1 that is configured to generate a mirrored read current $I_{Rmmsb}$ from the bit line BL read current $I_{Rmsb}$ formed by the cell currents $I_{CELL}$ of the memory cells 14 in the column (where $I_{Rmmsb}=^{-2}*I_{Rmsb}$).

More generally speaking, there is a weighted relationship between the current mirroring ratios of the current mirror connected transistors across the plurality of columns of memory cells storing multi-bit weight data. So, if a further bit line BLT<2> were involved, the current mirror connected transistors for that column, in accordance with the weighted relationship, may have a 1:4 current mirroring ratio.

At the current summing node 103, the mirrored read currents $I_{Rmlsb}$ and $I_{Rmmsb}$ are added together to generate a resulting output read current $I_{Rout}$. It will be noted that the current summation is implemented with a binary weighting due to the respective current mirroring ratios of the current mirroring circuits.

The output read current $I_{Rout}$ from the current summing node 103 is coupled through a switch S1 to an intermediate node 102. The open/close state of the switch S1 is controlled by the logic state of an integration signal INT. An integration capacitor Cint has a first terminal coupled, preferably directly connected, to the intermediate node 102 and a second terminal coupled, preferably directly connected, to the reference voltage (for example, ground) node. The intermediate node 102 is further coupled through a switch S2 to the reference voltage node. The open/close state of the switch S2 is controlled by the logic state of a reset signal RST.

The intermediate node 102 is further coupled to an input of an analog-to-digital converter (ADC) circuit 104 that operates to convert the analog voltage Vout across the integration capacitor Cint to a digital signal MACout indicative of the result of the MAC operation. One ADC circuit 104 may be provided for each set of columns storing the multibit weight data. Alternatively, one ADC circuit 104 may be shared by multiple sets of columns through a time division multiplexing operation. The digital signals MACout from each column may be output as the Decision from the column processing circuit 20 or combined with each other to generate the Decision.

In an alternate implementation, the drain of transistor M2 may be coupled to the summation node 103 through a switch S3. The open/close state of the switch S3 is controlled by the logic state of a multibit control signal MB. When the multibit control signal MB is in a first logic state corresponding to operation when multibit weight data is being processed, the switch S3 is closed. Conversely, if operating for an in-memory compute where single bit weight data is being processed, the multibit control signal MB is in a second logic state and the switch S3 is open. In this mode, the mirrored current output from transistor M2 would instead be coupled for integration by a different integration capacitor and the resulting voltage converted by a different ADC circuit or converted at a different time by the illustrated ADC circuit in time division multiplexing operation.

The switches S1, S2, S3 each may be implemented, for example, using a MOS transistor gate controlled by the appropriate one of the control signals RST, INT and MB.

Figure 7B:
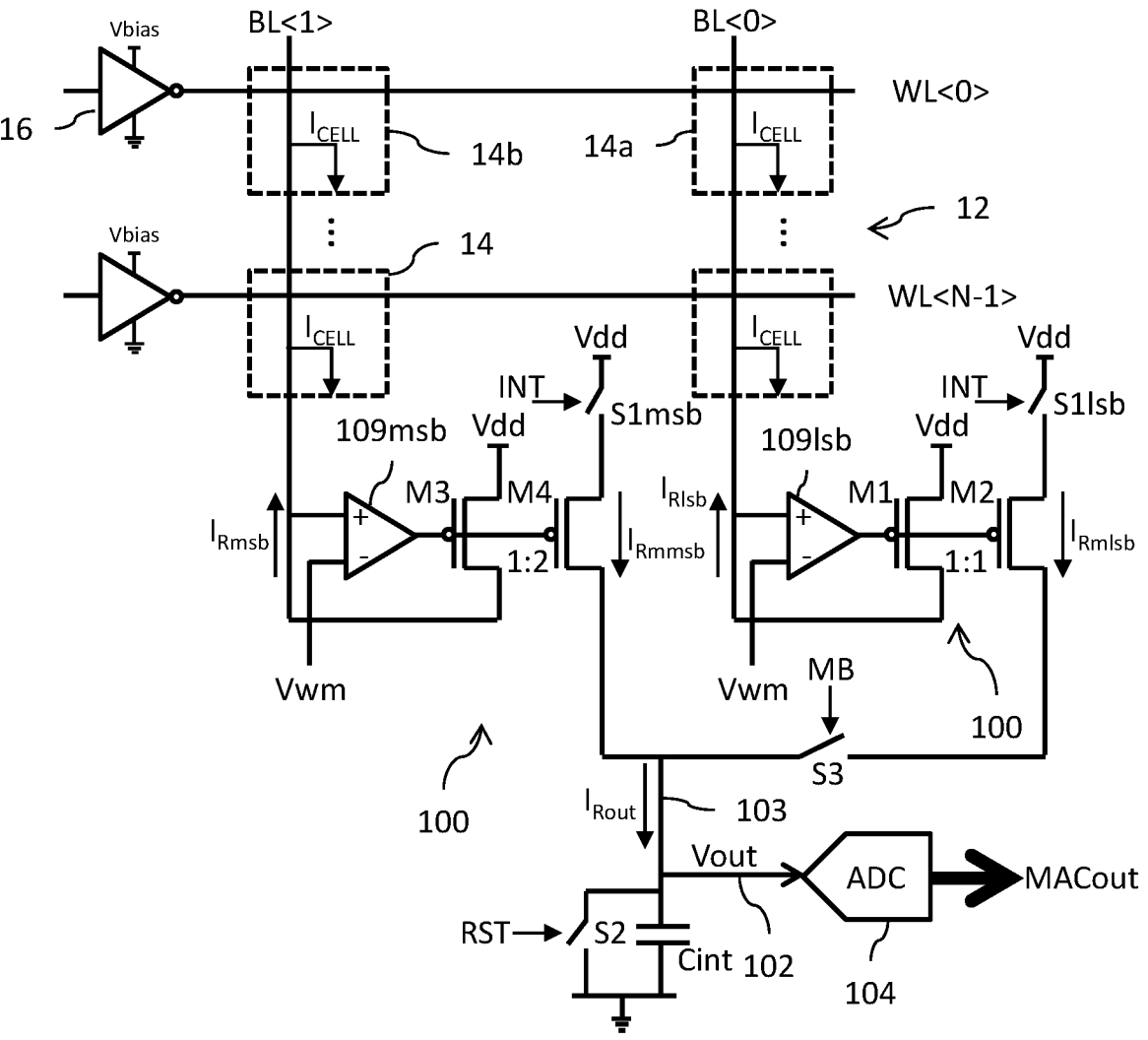

With reference to FIG. 7B, it will be understood that each of the read circuits 100 could alternatively be implemented in the manner shown in FIG. 4A. In this configuration, a switch S1lsb, S1msb is positioned between the source of each transistor M2, M4 respectively, and the supply voltage node. Here, the summation node 103 is coupled, preferably directly connected, to the intermediate node 102.

It will be understood that one bit line read circuit 100 is provided in the column processing circuit 20 for each column of the memory.

Operation of the bit line read circuit 100 is as follows: At a beginning of a computation cycle for an in-memory compute operation, the reset signal RST is asserted to close the switch S2 and discharge the integration capacitor Cint. Simultaneous application of word line signals dependent on the received feature data is then made to plural rows of memory cells 14 in the SRAM array 12 for the in-memory compute operation and less significant bit and more significant bit read currents $I_{Rlsb}$, $I_{Rmsb}$ develop on the bit lines BL<0> and BL<1>, respectively. The magnitudes of the read currents $I_{Rlsb}$, $I_{Rmsb}$ are a function of a sum of the currents $I_{CELL}$ sunk to ground by the memory cells 14 of each column which participates in the in-memory compute operation. The amplifier 109$lsb$ and transistor M1, respectively amplifier 109msb and transistor M3, function as a voltage clamping circuit configured to prevent the voltage on the bit line BL from falling below the reference voltage Vwm (which is greater than the write margin voltage where there is a risk of inadvertent bit flip). In other words, this circuitry functions to inhibit drop of a voltage on the bit line below a bit flip voltage during the in-memory compute operation when plural word lines are being simultaneously actuated. The integration signal INT is asserted to close the switch S1 and begin the integration time period. The transistors M1 and M2, M3 and M4 function as current mirroring circuits and corresponding mirrored read currents $I_{Rmlsb}$, $I_{Rmmsb}$ are applied (through closed switch S3) to the current summing node 103. The mirrored read currents $I_{Rmlsb}$, $I_{Rmmsb}$ are added together, and the resulting output read current $I_{Rout}$ is applied to charge the integration capacitor Cint and generate the output voltage Vout as a function of $I_{Rout}*t/C$, where t is the duration of the integration time period (when switch S1 is closed) and C is the capacitance of the integration capacitor Cint. When the integration time period expires, the integration signal INT is deasserted to open the switch S1. The voltage Vout across the integration capacitor Cint is then converted to the digital signal MACout by the ADC circuit 104.

Figure 8:
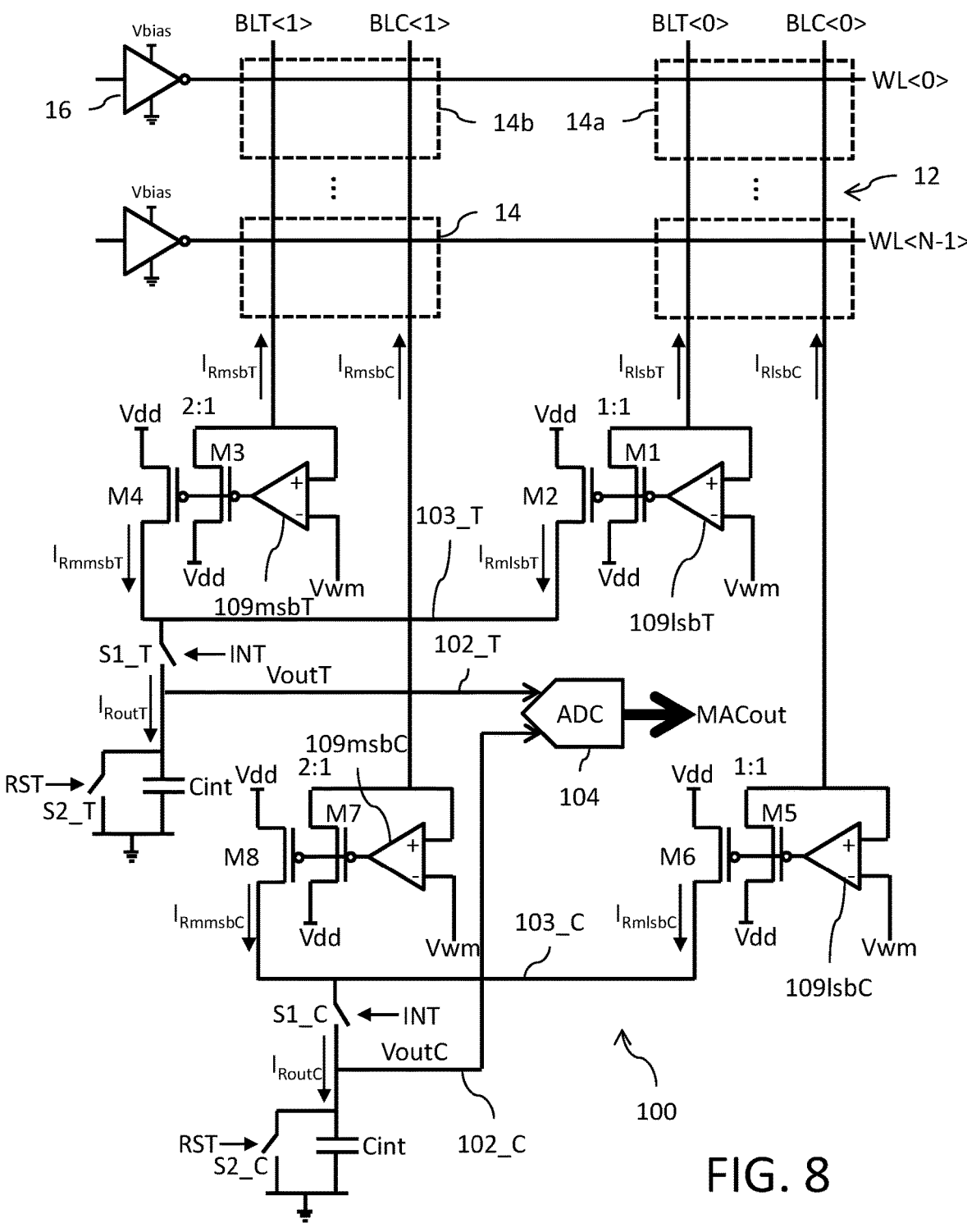
FIG. 8 is a circuit diagram for a differential signaling implementation of the bit line read circuit supporting multibit weight data.

Further to application of the implementations when multitib weight data is being processed, reference is now made to FIG. 8 (generally corresponding to the implementation of FIG. 5), where an implementation is shown for processing weight data having two bits stored in the memory cells 14$a$ and 14$b$ of two columns in the array associated with complementary bit lines BLT<0>, BLC<0> and BLT<1>, BLC<1>. In this example, the less significant bit (lsb) of the weight data is stored in memory cell 14$a$ and the more significant bit (msb) of the weight data is stored in memory cell 14$b$.

The true bit line BLT<0> for the less significant bit column of memory cells 14 in the array 12 is coupled, preferably directly connected, to a non-inverting input of a differential amplifier 109lsbT and is coupled, preferably directly connected, to a drain terminal of a p-channel MOS transistor M1. The source terminal of the transistor M1 is coupled, preferably directly connected, to a supply voltage Vdd node. The inverting input of the differential amplifier 109lsbT is coupled to receive a reference voltage Vwm having a voltage level set at greater than the write margin voltage for the memory cells 14. This write margin voltage is the bit line voltage where a risk of inadvertent bit flip in a 6T SRAM cell arises during simultaneous word line access for an in memory compute operation (for example, Vwm equals a voltage at or about Vdd/2). The output of the differential amplifier 109lsbT is coupled, preferably directly connected, to the gate terminal of the p-channel MOS transistor M1 and to the gate terminal of a p-channel MOS transistor M2. The source terminal of the transistor M2 is coupled, preferably directly connected, to the supply voltage Vdd node. The drain terminal of transistor M2 is coupled, preferably directly connected, to a true summation node 103_T. The transistors M1 and M2 form a current mirroring circuit, and the transistors M1, M2 are sized to provide a 1:1 current mirroring ratio between the bit line current $I_{RlsbT}$ and the mirrored bit line current $I_{RmlsbT}$(i.e., $I_{RmlsbT}=I_{RlsbT}$).

The true bit line BLT<1> for the more significant bit column of memory cells 14 in the array 12 is coupled, preferably directly connected, to a non-inverting input of a differential amplifier 109msbT and is coupled, preferably directly connected, to a drain terminal of a p-channel MOS transistor M3. The source terminal of the transistor M3 is coupled, preferably directly connected, to the supply voltage Vdd node. The inverting input of the differential amplifier 109msbT is coupled to receive the reference voltage Vwm. The output of the differential amplifier 109msbT is coupled, preferably directly connected, to the gate terminal of the p-channel MOS transistor M3 and to the gate terminal of a p-channel MOS transistor M4. The source terminal of the transistor M4 is coupled, preferably directly connected, to the supply voltage Vdd node. The drain terminal of transistor M4 is coupled, preferably directly connected, to the true summation node 103_T. The transistors M3 and M4 form a current mirroring circuit, and the transistors M3, M4 are sized to provide a 1:2 current mirroring ratio between the bit line current $I_{RmsbT}$ and the mirrored bit line current $I_{RmssbT}$ (i.e., $I_{RmmsbT}=2*I_{RmsbT}$) More generally speaking, there is a weighted relationship between the current mirroring ratios of the current mirror connected transistors across the plurality of columns of memory cells storing multi-bit weight data. So, if a further bit line BLT<2> were involved, the current mirror connected transistors for that column, in accordance with the weighted relationship, may have a 1:4 current mirroring ratio.

At the current summing node 103_T, the mirrored read currents $I_{RmlsbT}$ and $I_{RmmsbT}$ are added together to generate a resulting output true read current $I_{RoutT}$. It will be noted that the current summation is implemented with a binary weighting due to the respective current mirroring ratios of the current mirroring circuits.

The output read current $I_{RoutT}$ from the current summing node 103_T is coupled through a switch S1_T to an intermediate node 102_T. The open/close state of the switch S1_T is controlled by the logic state of an integration signal INT. An integration capacitor Cint has a first terminal coupled, preferably directly connected, to the intermediate node 102_T and a second terminal coupled, preferably directly connected, to the reference voltage (for example, ground) node. The intermediate node 102_T is further coupled through a switch S2_T to the reference voltage node. The open/close state of the switch S2_T is controlled by the logic state of a reset signal RST.

The switches S1_T, S2_T each may be implemented, for example, using a MOS transistor gate controlled by the appropriate one of the control signals RST and INT.

The complement bit line BLC<0> for the less significant bit column of memory cells 14 in the array 12 is coupled, preferably directly connected, to a non-inverting input of a differential amplifier 109lsbC and is coupled, preferably directly connected, to a drain terminal of a p-channel MOS transistor M5. The source terminal of the transistor M5 is coupled, preferably directly connected, to the supply voltage Vdd node. The inverting input of the differential amplifier 109lsbC is coupled to receive the reference voltage Vwm. The output of the differential amplifier 109lsbC is coupled, preferably directly connected, to the gate terminal of the p-channel MOS transistor M5 and to the gate terminal of a p-channel MOS transistor M6. The source terminal of the transistor M6 is coupled, preferably directly connected, to the supply voltage Vdd node. The drain terminal of transistor M6 is coupled, preferably directly connected, to a complement summation node 103_C. The transistors M5 and M6 form a current mirroring circuit, and the transistors M5, M6 are sized to provide a 1:1 current mirroring ratio between the bit line current $I_{RlsbC}$ and the mirrored bit line current $I_{RmlsbC}$ (i.e., $I_{RmlsbC}=I_{RlsbC}$).

The complement bit line BLC<1> for the more significant bit column of memory cells 14 in the array 12 is coupled, preferably directly connected, to a non-inverting input of a differential amplifier 109msbC and is coupled, preferably directly connected, to a drain terminal of a p-channel MOS transistor M7. The source terminal of the transistor M7 is coupled, preferably directly connected, to the supply voltage Vdd node. The inverting input of the differential amplifier 109msbC is coupled to receive the reference voltage Vwm. The output of the differential amplifier 109msbC is coupled, preferably directly connected, to the gate terminal of the p-channel MOS transistor M7 and to the gate terminal of a p-channel MOS transistor M8. The source terminal of the transistor M8 is coupled, preferably directly connected, to the supply voltage Vdd node. The drain terminal of transistor M8 is coupled, preferably directly connected, to the complement summation node 103_C. The transistors M7 and M8 form a current mirroring circuit, and the transistors M7, M8 are sized to provide a 1:2 current mirroring ratio between the bit line current $I_{RmsbC}$ and the mirrored bit line current $I_{RmssbC}$ (i.e., $I_{RmmsbC}=2*I_{RmsbC}$).

More generally speaking, there is a weighted relationship between the current mirroring ratios of the current mirror connected transistors across the plurality of columns of memory cells storing multi-bit weight data. So, if a further bit line BLC<2> were involved, the current mirror connected transistors for that column, in accordance with the weighted relationship, may have a 1:4 current mirroring ratio.

At the current summing node 103_C, the mirrored read currents $I_{RmlsbC}$ and $I_{RmmsbC}$ are added together to generate a resulting output complement read current $I_{RoutC}$. It will be noted that the current summation is implemented with a binary weighting due to the respective current mirroring ratios of the current mirroring circuits.

The output read current $I_{RoutC}$ from the current summing node 103_C is coupled through a switch S1_C to an intermediate node 102_C. The open/close state of the switch S1_C is controlled by the logic state of an integration signal INT. An integration capacitor Cint has a first terminal coupled, preferably directly connected, to the intermediate node 102_C and a second terminal coupled, preferably directly connected, to the reference voltage (for example, ground) node. The intermediate node 102_C is further coupled through a switch S2_C to the reference voltage node. The open/close state of the switch S2_C is controlled by the logic state of a reset signal RST.

The switches S1_C, S2_C each may be implemented, for example, using a MOS transistor gate controlled by the appropriate one of the control signals RST and INT.

The intermediate nodes 102_T, 102_C are further coupled to the differential inputs of an analog-to-digital converter (ADC) circuit 104 that operates to convert a difference between the analog voltages Vout_T, Vout_C to a digital signal MACout indicative of the result of the MAC operation. One ADC circuit 104 may be provided for each set of columns storing the multibit weight data. Alternatively, the ADC circuit 104 may be shared by multiple sets of columns through a time division multiplexing operation. The digital signals MACout from each column may be output as the Decision from the column processing circuit 20 or combined with each other to generate the Decision.

Operation of the bit line read circuit 100 is as follows: At a beginning of a computation cycle for an in-memory compute operation, the reset signal RST is asserted to close the switches S2_T, S2_C and discharge the integration capacitors Cint. Simultaneous application of word line signals dependent on the received feature data is then made to plural rows of memory cells 14 in the SRAM array 12 for the in-memory compute operation and true read currents $I_{RlsbT}$ and $I_{RmsbT}$ develop on the true bit lines BLT and complement read currents read currents $I_{RlsbC}$ and $I_{RmsbC}$ develop on the complement bit lines BLC. The magnitudes of these read currents are a function of a sum of the currents $I_{CELL}$ sunk to ground by the memory cells 14 of each column which participates in the in-memory compute operation. The integration signal INT is asserted to close the switches S1_T, S1_C and begin the integration time period. The amplifiers 109lsbT, 109msbT, 109lsbC, 109msbC with transistors M1, M3, M5 and M7 function as voltage clamping circuits configured to prevent the voltages on the bit lines BLT<0>, BLC<0>, BLT<1> and BLC<1> from falling below the reference voltage Vwm (which is greater than the write margin voltage where there is a risk of inadvertent bit flip) during the read operation. In other words, this circuitry functions to inhibit drop of a voltage on the bit line below a bit flip voltage during the in-memory compute operation when plural word lines are being simultaneously actuated. The true read currents $I_{RlsbT}$ and $I_{RmsbT}$ are mirrored to generate the true mirrored read currents $I_{RmlsbT}$ and $I_{RmmsbT}$ which are summed at the true current summation node 103_T to generate the output true read current $I_{RoutT}$. This current is applied to charge the integration capacitor Cint to generate the voltage Vout_T as a function of $I_{RoutT}*t/C$, where t is the duration of the integration time period (when switch S1_T is closed) and C is the capacitance of the integration capacitor Cint. The complement read currents $I_{RlsbC}$ and $I_{RmsbC}$ are mirrored to generate the true mirrored read currents $I_{RmlsbC}$ and $I_{RmmsbC}$ which are summed at the complement current summation node 103_C to generate the output complement read current $I_{RoutC}$. This current is applied to charge the integration capacitor Cint to generate the voltage Vout_C as a function of $I_{RoutC}*t/C$, where t is the duration of the integration time period (when switch S1_C is closed) and C is the capacitance of the integration capacitor Cint. When the integration time period expires, the integration signal INT is deasserted to open the switches S1_T, S1, C. A difference between the voltages Vout_T, Vout_C across the integration capacitors Cint is then converted to the digital signal MACout by the ADC circuit 104.

Figure 9:
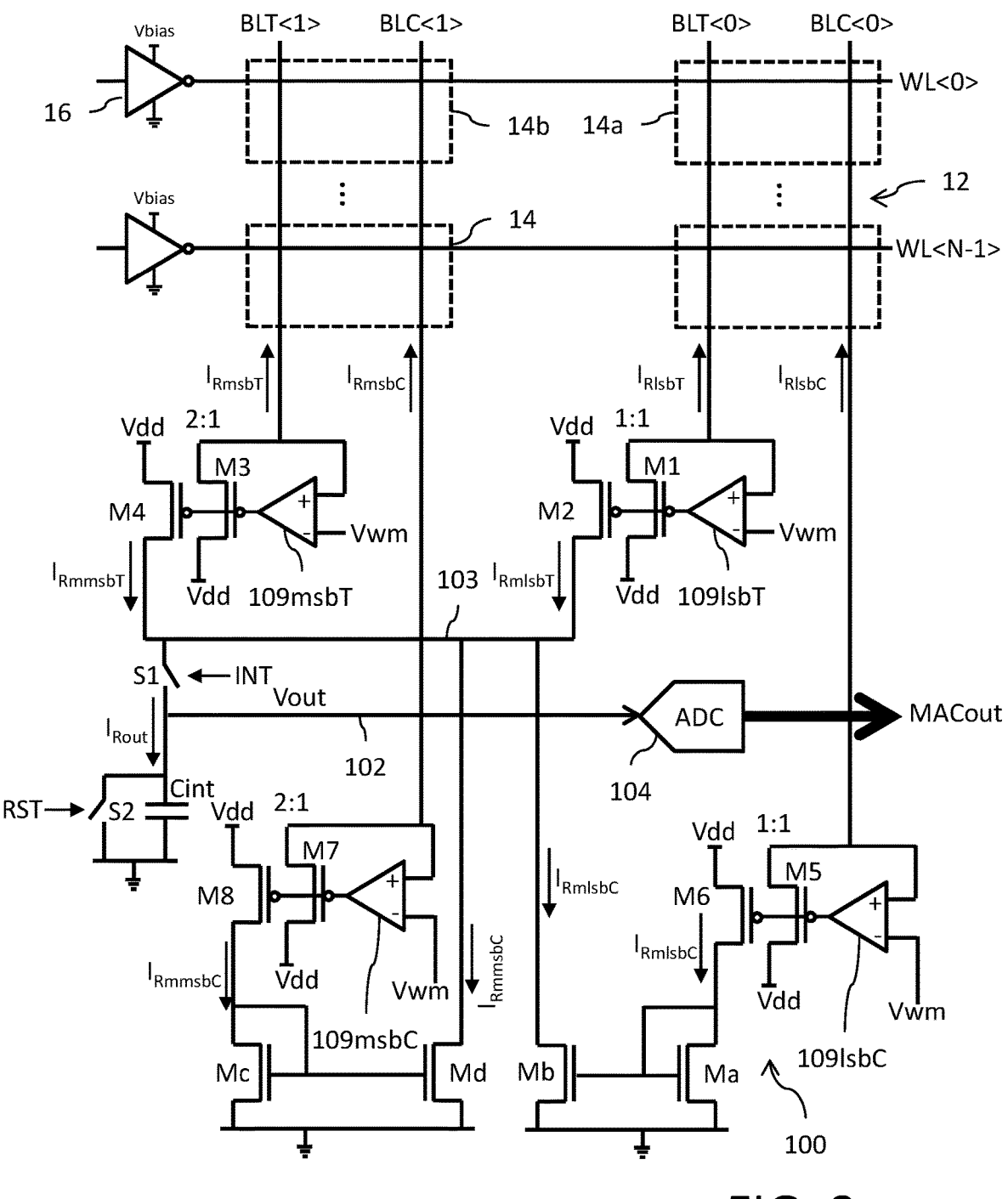
FIG. 9 is a circuit diagram for a single ended signaling implementation of the bit line read circuit supporting multibit weight data.

Still further to application of the implementations when multibit weight data is being processed, reference is now made to FIG. 9 (generally corresponding to the implementation of FIG. 6), where an implementation is shown for processing weight data having two bits stored in the memory cells 14a and 14b of two columns in the array associated with complementary bit lines BLT<0>, BLC<0> and BLT<1>, BLC<1>. In this example, the less significant bit (lsb) of the weight data is stored in memory cell 14a and the more significant bit (msb) of the weight data is stored in memory cell 14b.

The true bit line BLT<0> for the less significant bit column of memory cells 14 in the array 12 is coupled, preferably directly connected, to a non-inverting input of a differential amplifier 109lsbT and is coupled, preferably directly connected, to a drain terminal of a p-channel MOS transistor M1. The source terminal of the transistor M1 is coupled, preferably directly connected, to a supply voltage Vdd node. The inverting input of the differential amplifier 109lsbT is coupled to receive a reference voltage Vwm having a voltage level set at greater than the write margin voltage for the memory cells 14. This write margin voltage is the bit line voltage where a risk of inadvertent bit flip in a 6T SRAM cell arises during simultaneous word line access for an in memory compute operation (for example, Vwm equals a voltage at or about Vdd/2). The output of the differential amplifier 10lsbT9 is coupled, preferably directly connected, to the gate terminal of the p-channel MOS transistor M1 and to the gate terminal of a p-channel MOS transistor M2. The source terminal of the transistor M2 is coupled, preferably directly connected, to the supply voltage Vdd node. The drain terminal of transistor M2 is coupled, preferably directly connected, to a current summation node 103. The transistors M1 and M2 form a current mirroring circuit, and the transistors M1, M2 are sized to provide a 1:1 current mirroring ratio between the bit line current $I_{RlsbT}$ and the mirrored bit line current $I_{RmlsbT}$ (i.e., $I_{RmlsbT} I_{RlsbT}$).

The true bit line BLT<1> for the more significant bit column of memory cells 14 in the array 12 is coupled, preferably directly connected, to a non-inverting input of a differential amplifier 109msbT and is coupled, preferably directly connected, to a drain terminal of a p-channel MOS transistor M3. The source terminal of the transistor M3 is coupled, preferably directly connected, to the supply voltage Vdd node. The inverting input of the differential amplifier 109msbT is coupled to receive the reference voltage Vwm. The output of the differential amplifier 109msbT is coupled, preferably directly connected, to the gate terminal of the p-channel MOS transistor M3 and to the gate terminal of a p-channel MOS transistor M4. The source terminal of the transistor M4 is coupled, preferably directly connected, to the supply voltage Vdd node. The drain terminal of transistor M4 is coupled, preferably directly connected, to the summation node 103. The transistors M3 and M4 form a current mirroring circuit, and the transistors M3, M4 are sized to provide a 1:2 current mirroring ratio between the bit line current $I_{RmsbT}$ and the mirrored bit line current $I_{RmssbT}$ (i.e., $I_{RmmsbT}=2*I_{RmsbT}$).

More generally speaking, there is a weighted relationship between the current mirroring ratios of the current mirror connected transistors across the plurality of columns of memory cells storing multi-bit weight data. So, if a further bit line BLT<2> were involved, the current mirror connected transistors for that column, in accordance with the weighted relationship, may have a 1:4 current mirroring ratio.

The complement bit line BLC<0> for the less significant bit column of memory cells 14 in the array 12 is coupled, preferably directly connected, to a non-inverting input of a differential amplifier 109lsbC and is coupled, preferably directly connected, to a drain terminal of a p-channel MOS transistor M5. The source terminal of the transistor M5 is coupled, preferably directly connected, to the supply voltage Vdd node. The inverting input of the differential amplifier 109lsbC is coupled to receive the reference voltage Vwm. The output of the differential amplifier 109lsbC is coupled, preferably directly connected, to the gate terminal of the p-channel MOS transistor M5 and to the gate terminal of a p-channel MOS transistor M6. The source terminal of the transistor M6 is coupled, preferably directly connected, to the supply voltage Vdd node. The drain terminal of transistor M6 is coupled, preferably directly connected, to the input of an n-channel MOS current mirror circuit formed by transistors Ma and Mb. An output of the n-channel MOS current mirror circuit is coupled, preferably directly connected, to the current summation node 103. The transistors M5 and M6 form a current mirroring circuit, and the transistors M5, M6 are sized to provide a 1:1 current mirroring ratio between the bit line current $I_{RlsbC}$ and the mirrored bit line current $I_{RmlsbC}$ (i.e., $I_{RmlsbC}=I_{RlsbC}$).

The complement bit line BLC<1> for the more significant bit column of memory cells 14 in the array 12 is coupled, preferably directly connected, to a non-inverting input of a differential amplifier 109msbC and is coupled, preferably directly connected, to a drain terminal of a p-channel MOS transistor M7. The source terminal of the transistor M7 is coupled, preferably directly connected, to the supply voltage Vdd node. The inverting input of the differential amplifier 109msbC is coupled to receive the reference voltage Vwm. The output of the differential amplifier 109msbC is coupled, preferably directly connected, to the gate terminal of the p-channel MOS transistor M7 and to the gate terminal of a p-channel MOS transistor M8. The source terminal of the transistor M8 is coupled, preferably directly connected, to the supply voltage Vdd node. The drain terminal of transistor M8 is coupled, preferably directly connected, to the input of an n-channel MOS current mirror circuit formed by transistors Mc and Md. An output of the n-channel MOS current mirror circuit is coupled, preferably directly connected, to the current summation node 103. The transistors M7 and M8 form a current mirroring circuit, and the transistors M7, M8 are sized to provide a 1:2 current mirroring ratio between the bit line current $I_{RmsbC}$ and the mirrored bit line current $I_{RmsbC}$ (i.e., $I_{RmmsbC}=2*I_{RmsbC}$).

More generally speaking, there is a weighted relationship between the current mirroring ratios of the current mirror connected transistors across the plurality of columns of memory cells storing multi-bit weight data. So, if a further bit line BLC<2> were involved, the current mirror connected transistors for that column, in accordance with the weighted relationship, may have a 1:4 current mirroring ratio.

At the current summing node 103, the sum of the mirrored complement read currents $I_{RmlsbC}$ and $I_{RmmsbC}$ is subtracted from the sum of the mirrored true read currents $I_{RmlsbT}$ and $I_{RmmsbT}$ to generate a resulting output read current $I_{Rout}$ (i.e., $I_{Rout}=I_{RmlsbT}+I_{RmmsbT}-I_{RmlsbC}-I_{RmmsbC}$).

The output read current $I_{Rout}$ from the current summing node 103 is coupled through a switch S1 to an intermediate node 102. The open/close state of the switch S1 is controlled by the logic state of an integration signal INT. An integration capacitor Cint has a first terminal coupled, preferably directly connected, to the intermediate node 102 and a second terminal coupled, preferably directly connected, to the reference voltage (for example, ground) node. The intermediate node 102 is further coupled through a switch S2 to the reference voltage node. The open/close state of the switch S2 is controlled by the logic state of a reset signal RST.

The switches S1, S2 each may be implemented, for example, using a MOS transistor gate controlled by the appropriate one of the control signals RST and INT.

The intermediate node 102 is further coupled to the input of an analog-to-digital converter (ADC) circuit 104 that operates to convert the analog voltage Vout to a digital signal MACout indicative of the result of the MAC operation. One ADC circuit 104 may be provided for each set of columns storing the multibit weight data. Alternatively, the ADC circuit 104 may be shared by multiple sets of columns through a time division multiplexing operation. The digital signals MACout from each column may be output as the Decision from the column processing circuit 20 or combined with each other to generate the Decision.

Operation of the bit line read circuit 100 is as follows: At a beginning of a computation cycle for an in-memory compute operation, the reset signal RST is asserted to close the switch S2 and discharge the integration capacitor Cint. Simultaneous application of word line signals dependent on the received feature data is then made to plural rows of memory cells 14 in the SRAM array 12 for the in-memory compute operation and true read currents $I_{RlsbT}$ and $I_{RmsbT}$ develop on the true bit lines BLT and complement read currents read currents $I_{RlsbC}$ and $I_{RmsbC}$ develop on the complement bit lines BLC. The magnitudes of these read currents are a function of a sum of the currents $I_{CELL}$ sunk to ground by the memory cells 14 of each column which participates in the in-memory compute operation. The integration signal INT is asserted to close the switch S1 and begin the integration time period. The amplifiers 109lsbT, 109msbT, 109lsbC, 109msbC with transistors M1, M3, M5 and M7 function as voltage clamping circuits configured to prevent the voltages on the bit lines BLT<0>, BLC<0>, BLT<1> and BLC<1> from falling below the reference voltage Vwm (which is greater than the write margin voltage where there is a risk of inadvertent bit flip) during the read operation. In other words, this circuitry functions to inhibit drop of a voltage on the bit line below a bit flip voltage during the in-memory compute operation when plural word lines are being simultaneously actuated. The true read currents $I_{RlsbT}$ and $I_{RmsbT}$ are mirrored to generate the true mirrored read currents $I_{RmlsbT}$ and $I_{RmmsbT}$ which are summed at the current summation node 103. The complement read currents $I_{RlsbC}$ and $I_{RmsbC}$ are mirrored to generate the true mirrored read currents $I_{RmlsbC}$ and $I_{RmmsbC}$ which are subtracted from the current summation node 103. The result is the generation of the output read current $I_{Rout}$. This current is applied to charge the integration capacitor Cint to generate the voltage Vout as a function of $I_{Rout}*t/C$, where t is the duration of the integration time period (when switch S1 is closed) and C is the capacitance of the integration capacitor Cint. When the integration time period expires, the integration signal INT is deasserted to open the switch S1. The voltage Vout across the integration capacitor Cint is then converted to the digital signal MACout by the ADC circuit 104.

Figure 10:
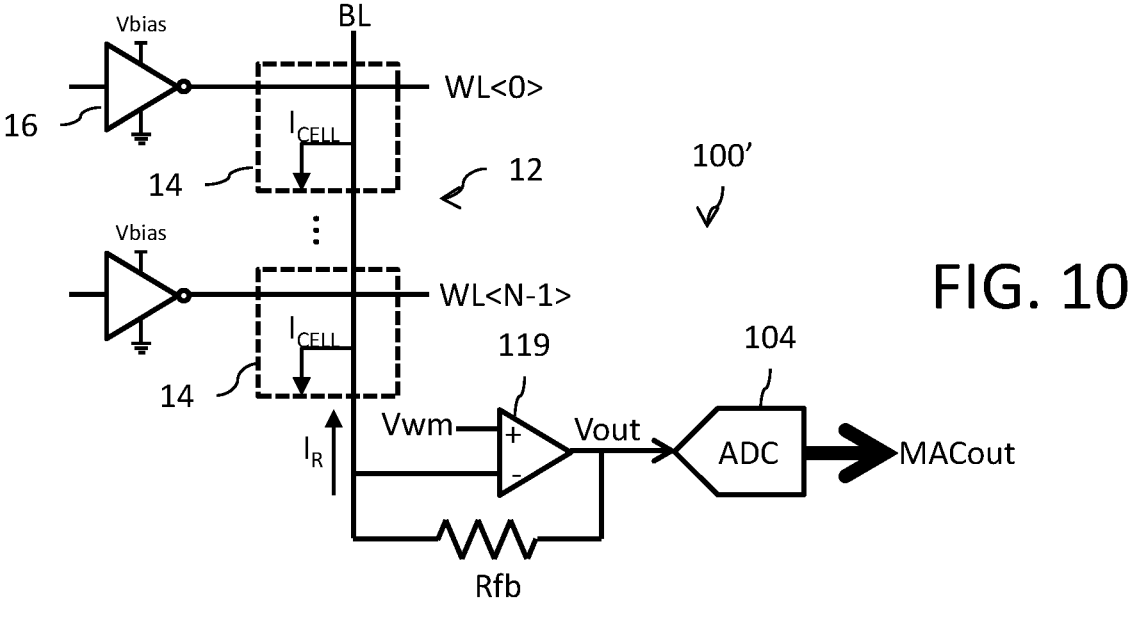
FIG. 10 is a circuit diagram for a bit line read circuit.

Reference is now made to FIG. 10 which shows a circuit diagram for a bit line read circuit 100' used within the column processing circuit 20. A bit line BL for a given column of memory cells 14 in the array 12 is coupled, preferably directly connected, to an inverting input of a differential amplifier 119. The output of the differential amplifier 119 is coupled to the inverting input by a feedback resistor Rfb. The non-inverting input of the differential amplifier 109 is coupled to receive a reference voltage Vwm having a voltage level set at greater than the write margin voltage for the memory cells 14. This write margin voltage is the bit line voltage where a risk of inadvertent bit flip in a 6T SRAM cell arises during simultaneous word line access for an in memory compute operation (for example, Vwm equals a voltage at or about Vdd/2). The output of the differential amplifier 119 is coupled, preferably directly connected, to an input of an analog-to-digital converter (ADC) circuit 104 that operates to convert the analog voltage Vout to a digital signal MACout indicative of the result of the MAC operation. One ADC circuit 104 may be provided for each column. Alternatively, one ADC circuit 104 may be shared by multiple columns through a time division multiplexing operation. The digital signals MACout from each column may be output as the Decision from the column processing circuit 20 or combined with each other to generate the Decision.

It will be understood that one bit line read circuit 100' is provided in the column processing circuit 20 for each column of the memory.

Operation of the bit line read circuit 100' is as follows: Simultaneous application of word line signals dependent on the received feature data is made to plural rows of memory cells 14 in the SRAM array 12 for a computation cycle of an in-memory compute operation. A read current $I_R$ develops on the bit line BL. The magnitude of the read current $I_R$ is a function of a sum of the currents $I_{CELL}$ sunk to ground by the memory cells 14 of the column which participates in the in-memory compute operation. The configuration of the amplifier 119 with resistive feedback forms a voltage addition circuit which adds the Vwm to the voltage $V_R$ (where $V_R=I_R*$Rfb) to generate the voltage Vout at the output of the amplifier 119. The voltage Vout is then converted to the digital signal MACout by the ADC circuit 104. The amplifier 119 with resistive feedback further operates as voltage clamping circuit to clamp the voltage on the bit line BL to the voltage Vwm and thus preclude voltage drop on the bit line BL below the write margin level during the in-memory compute operation where multiple word lines are being simultaneously asserted.

Figure 11:
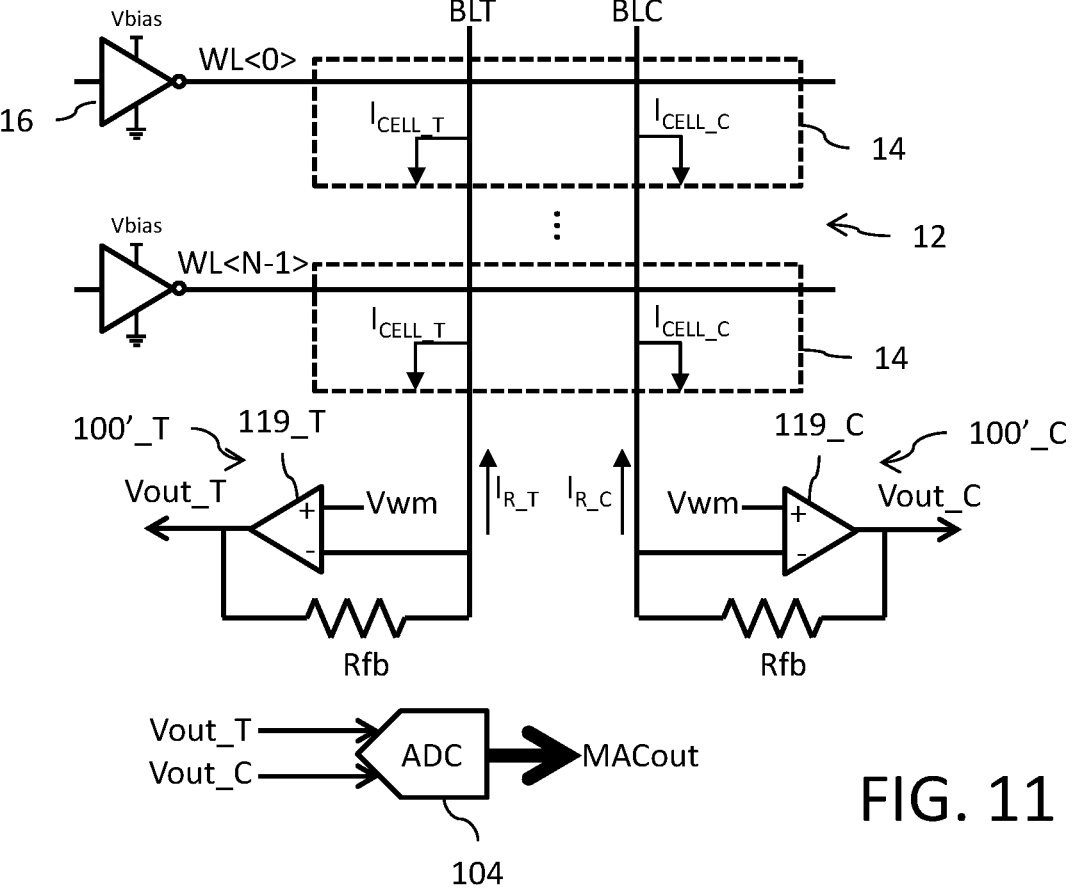
FIG. 11 is a circuit diagram for a differential signaling implementation of the bit line read circuit.

Reference is now made to FIG. 11 which shows a circuit diagram for a differential signaling implementation of the bit line read circuit 100'. Like references refer to same or similar components. In this implementation, the currents on the true bit line BLT and the complement bit line BLC are processed by the bit line read circuit 100'. The use of the suffix "_T" designates components associated with the processing of the read current on the true bit line BLT, and the use of the suffix "_C" designates components associated with the processing of the read current on the complement bit line BLC. Thus, the bit line read circuit 100' comprises a true read circuit 100'_T for processing the read current $I_{R\_T}$ on the true bit line BLT and a complement read circuit 100'_C for processing the read current $I_{R\_C}$ on the complement bit line BLC. The circuit configuration for each of the read circuits 100'_T, 100'_C is the same as shown in FIG. 10 and each circuit operates in the manner described above. The differential signaling implementation in FIG. 11 differs from the implementation of FIG. 10 in that differential integration voltages Vout_T, Vout_C are generated by the bit line read circuits 100'_T, 100'_T and the ADC circuit 104 operates to convert a difference between the voltages Vout_T, Vout_C for the digital signal MACout.

With reference now to the true read circuit 100'_T, the true bit line BLT for a given column of memory cells 14 in the array 12 is coupled, preferably directly connected, an inverting input of a differential amplifier 119_T. The output of the differential amplifier 119_T is coupled to the inverting input by a feedback resistor Rfb. The non-inverting input of the differential amplifier 119_T is coupled to receive a reference voltage Vwm having a voltage level set at greater than the write margin voltage for the memory cells 14. This write margin voltage is the bit line voltage where a risk of inadvertent bit flip in a 6T SRAM cell arises during simultaneous word line access for an in memory compute operation (for example, Vwm equals a voltage at or about Vdd/2).

With reference now to the complement read circuit 100'_C, the complement bit line BLC for the given column of memory cells 14 in the array 12 is coupled, preferably directly connected, an inverting input of a differential amplifier 119_C. The output of the differential amplifier 119_C is coupled to the inverting input by a feedback resistor Rfb. The non-inverting input of the differential amplifier 119_C is coupled to receive the reference voltage Vwm.

The outputs of the differential amplifiers 119_T, 119_C are coupled, preferably directly connected, to the differential inputs of an analog-to-digital converter (ADC) circuit 104 that operates to convert a difference between the analog voltages Vout_T and Vout_C to a digital signal MACout indicative of the result of the MAC operation. One ADC circuit 104 may be provided for each column. Alternatively, one ADC circuit 104 may be shared by multiple columns through a time division multiplexing operation. The digital signals MACout from each column may be output as the Decision from the column processing circuit 20 or combined with each other to generate the Decision.

It will be understood that one pair of bit line read circuits 100'_T, 100'_C is provided in the column processing circuit 20 for each column of the memory.

Operation of the bit line read circuit 100' is as follows: Simultaneous application of word line signals dependent on the received feature data is made to plural rows of memory cells 14 in the SRAM array 12 for a computation cycle of an in-memory compute operation. Read currents $I_{R\_T}$ and $I_{R\_C}$ develop on the complementary bit lines BLT, BLC. The magnitude of the read currents $I_{R\_T}$ and $I_{R\_C}$ are a function of a sum of the currents $I_{CELL}$ sunk to ground by the memory cells 14 of each column which participates in the in-memory compute operation. The configuration of each amplifier 119 with resistive feedback forms a voltage addition circuit which adds the write margin voltage Vwm to a voltage $V_{R\_T}$, $V_{R\_C}$ (where $V_R=I_R*$Rfb) to generate the voltages Vout_T, Vout_C at the outputs of the amplifiers 119_T, 119_C. The difference between the voltages Vout_T, Vout_C is then converted to the digital signal MACout by the ADC circuit 104. The amplifiers 119_T, 119_C with resistive feedback each further operate as a voltage clamping circuit to clamp the voltage on the complementary bit lines BLT, BLC to the voltage Vwm and thus preclude voltage drop on the bit lines BLT, BLC below the write margin level during the in-memory compute operation where multiple word lines are being simultaneously asserted.

Figure 12:
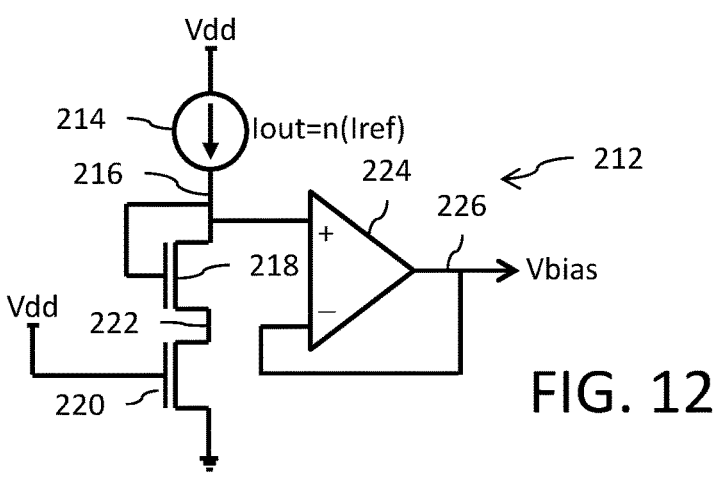
FIG. 12-13 are circuit diagrams for a bias voltage generator.

The implementations in FIGS. 4A, 4B, 5, 6, 7A, 7B, 8, 9, 10 and 11 further utilize an adaptive supply voltage Vbias for word line driving. The supply voltage for the word line driver circuit 16 is not fixed equal to Vdd (i.e., it is not the same as the array supply voltage) or set with a fixed word line under voltage level (for example, $V_{WLUD}=$Vdd/2). Instead, the supply voltage for the word line driver circuit 16 is an adaptive supply voltage Vbias modulated dependent on integrated circuit process conditions. The voltage level of this adaptive supply voltage Vbias is less than the supply voltage Vdd and is generated by a voltage generator circuit 212 as shown in FIG. 12 with a voltage level that is proportional (by a factor of n) to a reference current Iref level. The reference current Iref has a magnitude defined by the fast n-channel MOS process lot. As an example, the reference current Iref for a given bit cell is the current where the multi row access write margin (MRAWM—which is the maximum level of the bit-line voltage needed to write into bit-cell) is zero while allowing for full rail-to-rail swing of bit lines at the worst process corner. The value of n for the proportionality factor is set by design and is based on a desired variability of the adaptive supply voltage Vbias level (such that n numbers of replica will effectively minimize the variation of Vbias due to local variation).

The voltage generator circuit 212 includes a current source 214 powered from the supply voltage Vdd and generating an output current Iout at node 216 where the current source is connected in series with the series connection of a first n-channel MOS transistor 218 and second n-channel MOS transistor 220. The output current Iout is applied (i.e., forced) to a circuit with transistors 218 and 220 to generate the bias voltage Vbias, wherein the transistors 218 and 220 effectively replicate the pass-gate and pull-down transistor configuration depicting the read condition of the memory cell 14. The first n-channel MOS transistor 218 has a drain coupled (preferably directly connected) to node 216 and a source coupled (preferably directly connected) to node 222. A gate of the first n-channel MOS transistor 218 is coupled (preferably directly connected) to the drain at node 216, thus configuring transistor 218 as a diode-connected device. The first n-channel MOS transistor 218 is a scaled replica of the n-channel transfer (passgate) transistors 26 and 28 within each memory cell 14, where the scaling factor is equal to n. In this context, "scaled replica" means that the transistor 218 is made identically using the same integrated circuit process materials and parameters (doping levels, oxide thickness, gate materials, etc.) as each of the transistors 26 and 28 for cell 14 but is an n times repetition of the single transistor providing an effectively larger width. As an example, the transistor 218 may be fabricated by connecting n transistors in parallel which are identical (matching) to each of the transistors 26 and 28. The second n-channel MOS transistor 220 has a drain coupled (preferably directly connected) to node 222 and a source coupled (preferably directly connected) to the ground supply reference. A gate of the second n-channel MOS transistor 220 is coupled (preferably directly connected) to receive the supply voltage Vdd. The second n-channel MOS transistor 220 is a scaled replica of the n-channel pulldown transistors 34 and 36 within each memory cell 14, where the scaling factor is equal to n. As an example, the transistor 220 may be fabricated by connecting n transistors in parallel which are identical (matching) to each of the transistors 34 and 36 for cell 14.

The bias voltage Vbias generated at node 216 is equal to:

$$Vbias = n(Iref)(Rdson218 + Rdson220),$$

where: Rdson218 is the resistance from drain to source of the diode-connected first n-channel MOS transistor 218, and Rdson220 is the resistance from drain to source of the second n-channel MOS transistor 220 gate biased by supply voltage Vdd. The series connected transistors 218 and 220 replicate, subject to the scaling factor n, the current path in the memory cell 14 from the bit line (BL, BLT or BLC) to ground in the operating condition where the pass gate transistor and its pull down transistor on one side of the memory cell are both turned on during the read operation.

A differential amplifier circuit 224 configured as a unity gain voltage follower receives the Vbias voltage at its non-inverting input and generates the Vbias voltage at its output 226 with sufficient drive capacity to power all of the word line driver circuits 16 for the simultaneously actuated word lines during an in-memory compute operation. The output of the differential amplifier circuit 224 is shorted to the inverting input.

Figure 13:
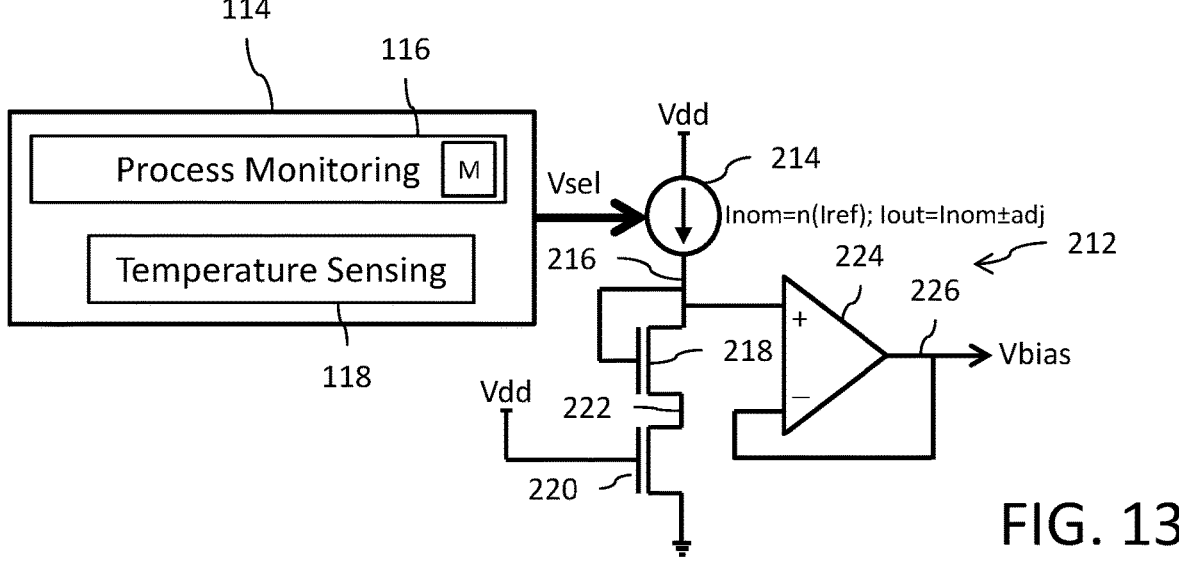

Reference is now made to FIG. 13 which shows a schematic diagram of an alternate embodiment for the voltage generator circuit 212. The voltage generator circuit 212 in FIG. 13 differs from the implementation shown in FIG. 12 in that a further integrated circuit process and/or temperature based tuning of the magnitude of the current Iout output by the current source 214 within the voltage generator circuit 212 is supported. In this context, the current source 214 is formed by a variable current source having a base (or nominal) current Inom magnitude equal to n(Iref) with a positive or negative adjustment adj from that base current magnitude level set by a control signal. In other words, the magnitude of the current output Iout by the current source 214 is equal to n(Iref)±adj, where adj is the adjustment set by the control signal. In an embodiment, the control signal is a multi-bit digital control signal Vsel, but it will be understood that the control signal can instead be implemented as an analog signal. The value of the control signal (in particular, the digital values of the bits of the control signal Vsel) selects the degree of adjustment made to the magnitude of the current output by the current source 214. The control signal Vsel is generated by a control circuit 114 in response to integrated circuit process and/or temperature information. Thus, the level of the adaptive supply voltage Vbias is now additionally dependent on that integrated circuit process and/or temperature information.

The integrated circuit process information is a digital code generated and stored in a memory M within the control circuit 114. The digital code represents the centering of the process lot and is generated by circuitry such as, for example, ring oscillators (RO) whose output frequency varies dependent on integrated circuit process. The output frequencies of the RO circuits thus represent the process centering and can easily be converted into a digital code (for example, through the use of counter circuits). A process monitoring circuit 116 within the control circuit 114 can generate the value of the control signal Vsel as a function of the stored digital code for the integrated circuit process. For example, the process monitoring circuit 116 may include a look-up table (LUT) that correlates each digital code with a value of the control signal Vsel for selecting the positive or negative adjustment adj of the nominal magnitude of the current generated by the current source 214 to ensure that the voltage level of the adaptive supply voltage Vbias will produce the optimal level of word line underdrive for the integrated circuit process corner. The control circuit 114 outputs the value of the control signal Vsel correlated to the digital code and the voltage generator circuit 212 responds by generating the corresponding voltage level for the adaptive supply voltage Vbias.

The temperature information is generated by a temperature sensing circuit 118 and represents a current temperature of the integrated circuit. The temperature sensing circuit 118 may modify or adjust the value of the control signal Vsel as a function of the sensed temperature. For example, the temperature sensing circuit 118 may include a look-up table (LUT) that specifies a certain adjustment in the value of the control signal Vsel for providing a corresponding tuning of the magnitude of the current output by the current source 214 to ensure that the level of the adaptive supply voltage Vbias will produce the optimal level of word line underdrive given the integrated circuit process corner and current temperature condition.

Figure 14:
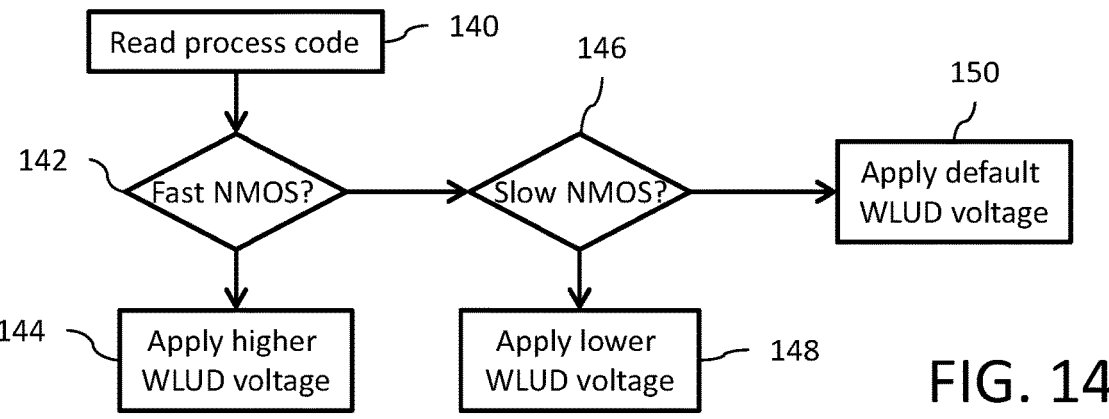
FIG. 14 shows a flow diagram for operation of the circuit shown in FIG. 13.

Reference is now made to FIG. 14 which shows a flow diagram for operation of the control circuit 114 and process monitoring circuit 116 for the circuit of FIG. 13. In step 140, the stored digital code for the integrated circuit process is read from the memory M. In an embodiment, the digital code for the integrated circuit process is loaded at the factory into the memory M, and this digital code is based on the identified integrated circuit process characteristic (fast/slow corner, etc.) for the integrated circuit fabrication lot (for example, the source wafer) from which the integrated circuit is obtained. Next, in step 142, a determination is made as to whether the read digital code for the integrated circuit process indicates that the n-channel MOS transistors of the memory cells 12 are at the fast integrated circuit process corner (i.e., where and n-channel MOS speed is fast and p-channel MOS speed is slow—the "FS" corner). If yes, then a value of the control signal Vsel is selected in step 144 which corresponds to the read digital code and which will cause a negative adjustment adj in the magnitude of the current output by the current source 214 so that the voltage regulator circuit 212 will produce a higher degree of word line underdrive (i.e., the level for the adaptive supply voltage Vbias will be lower than a nominal (or default) level for word line underdrive set by the nominal current magnitude n(Iref)). The effect of setting the adaptive supply voltage Vbias to a voltage level that is lower than the nominal (or default) voltage level is to reduce the MRAWM. Reducing the MRAWM results in degradation of the write-ability of the bit cell and improvement of the data flip rate which are of concern at the fast n-channel MOS corners. This lower than nominal (or default) voltage level also enables a higher headroom for bit line swing, and as a result there is a higher precision for the bit line accumulation value in the in-memory compute operation. If no in step 142, then in step 146 a determination is made as to whether the read digital code for the integrated circuit process indicates that the n-channel MOS transistors of the memory cells 12 are at the slow integrated circuit process corner (i.e., where n-channel MOS speed is slow and p-channel MOS speed is fast—the "SF" corner). If yes, then a value of the control signal Vsel is selected in step 148 which corresponds to the read digital code and which will cause a positive adjustment adj in the magnitude of the current output by the current source 214 so that the voltage regulator circuit 212 will produce a lower degree of word line underdrive (i.e., the level for the adaptive supply voltage Vbias is higher than the nominal (or default) level for word line underdrive set by the nominal current magnitude n(Iref)). The effect of setting the adaptive supply voltage Vbias to a voltage level that is higher than the nominal (or default) voltage level is to increase the multi row access write margin (MRAWM), resulting in an improved cell current while still controlling the data flip rate which is of less concern at slow NMOS corners. This higher than nominal (or default) voltage level also reduces the local variation effect of the slow process corner. If no in step 146, then in step 150 a value of the control signal Vsel is selected which corresponds to the read digital code and which will cause no adjustment (i.e., adj=0) in the n(Iref) magnitude of the current output by the current source 214 so that the voltage regulator circuit 212 will produce a level for the adaptive supply voltage Vbias that is equal to the nominal (or default) level for word line underdrive as set by the nominal current Inom.

Although the process of FIG. 14 contemplates three levels of voltage control (higher than, lower than, and equal to, nominal), it will be understood that this is by example only. Additional testing steps may be added to the process of FIG. 14 to test for other integrated circuit process corner or process-related conditions (for example, fast-fast (FF) and/or slow-slow (SS) corners), with each test having an associated digital code and value of the control signal Vsel for setting a corresponding level of the adjustment for the current output by the current source 214 of the voltage generator circuit 212.

Figure 15:
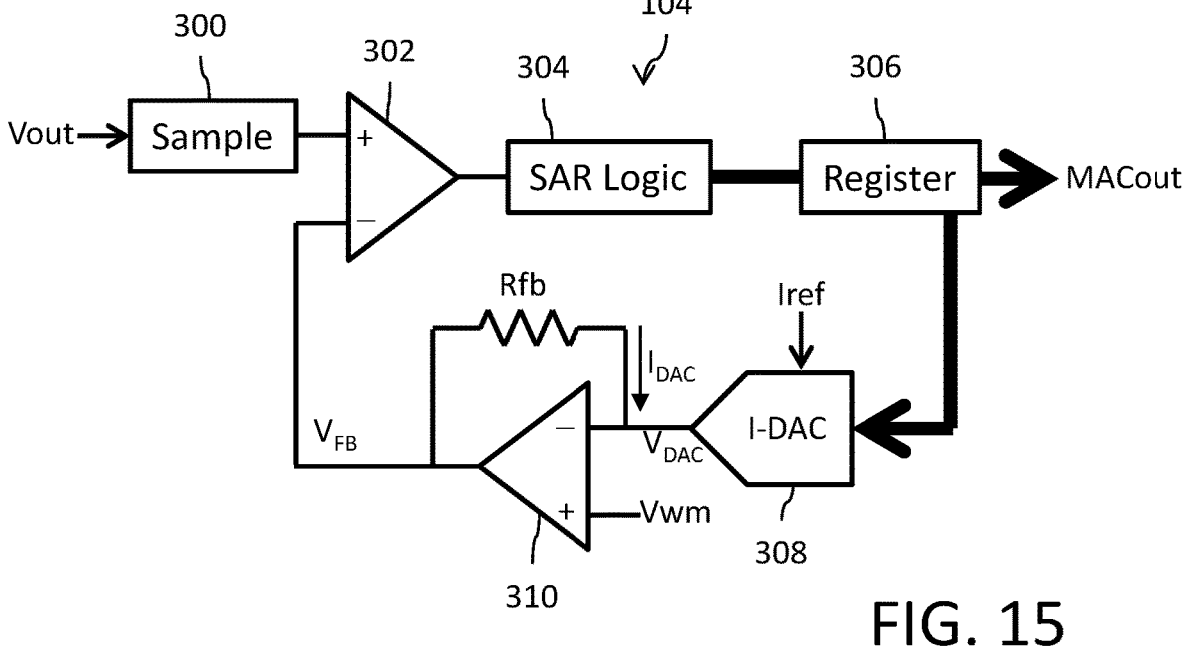
FIG. 15 is a block diagram of an analog-to-digital converter circuit.

Reference is now made to FIG. 15 which shows a circuit diagram for an embodiment of the ADC circuit 104. The ADC circuit 104 may be implemented as shown as a successive approximation register (SAR) type circuit. A sampling circuit 300 has an input coupled, preferably directly connected, to receive the output voltage Vout of the read circuit 100, 100'. An output of the sampling circuit 300 is coupled, preferably directly connected, to the non-inverting input of a comparator circuit 302. The inverting input of the comparator circuit 302 is coupled to receive a feedback voltage $V_{FB}$. The logic output of the comparator circuit 302 is coupled, preferably directly connected, to a SAR logic circuit 304 with a register 306. At an end of the conversion time period, the output of the register 306 provides the digital signal MACout of the ADC circuit 104 (i.e., the digital value corresponding to the analog voltage Vout). The bits of the register 306 are further coupled, preferably directly connected, to the input of a digital-to-analog converter (DAC) circuit 308. In particular, the DAC circuit 308 is implemented as a current DAC where the bits of the digital signal MACout actuate current sources to generate an output current $I_{DAC}$ and a corresponding output voltage $V_{DAC}$. The current sources of the current DAC 308 are referenced (i.e., mirrored) to a reference current source generating a reference current Iref (which is also used, as shown in FIGS. 12 and 13 in connection with the generation of the word line driver 16 bias voltage Vbias). The output of the current DAC 308 is coupled, preferably directly connected, to the inverting input of a differential amplifier circuit 310. The non-inverting input of the differential amplifier circuit 310 is coupled to receive the reference voltage Vwm (which is also used, as shown in FIGS. 4A, 4B, 5, 6, 7A, 7B, 8, 9, 10 and 11 as the reference voltage for the clamping circuit of the read circuit 100, 100'). The reference voltage Vwm has a voltage level set at greater than the write margin voltage for the memory cells 14 representing a voltage greater than the bit line voltage where a risk of inadvertent bit flip in a 6T SRAM cell arises during simultaneous word line access for an in memory compute operation (for example, Vwm equals a voltage at or about Vdd/2). An output of the differential amplifier circuit 310 is coupled, preferably directly connected, to the inverting input by a feedback resistor Rfb. The configuration of the amplifier with resistive feedback forms a voltage addition circuit which adds the Vwm to the voltage $V_{DAC}$. (where $V_{DAC}=I_{DAC}*Rfb$). The output of the differential amplifier circuit 310 generates the feedback voltage $V_{FB}$.

The output voltage Vout (from the read circuits 100, 100') is sampled and held by the sampling circuit 300. A binary search algorithm is then implemented by the SAR logic 304. The most significant bit in the register 306 is set to logic 1 and all other bits are set to logic 0. The current DAC circuit 308 converts this to the voltage $V_{DAC}$ and the feedback voltage $V_{FB}$ ($V_{DAC}$+Vwm) is compared by comparator 302 to Vout (sampled). Note here that the voltage offset Vwm introduced by amplifier 310 with feedback is needed to compensate for the corresponding voltage offset (Vwm) introduced by the clamping circuit of the read circuits 100, 100' and thus ensure that the converted output digital signal MACout accurately reflects the read current. If Vout>$V_{FB}$, then the most significant bit remains set at logic 1. Otherwise, the most significant bit in the register 306 is set to logic 0. The algorithm then moves to the next most significant bit and sets its value of 1 (no change is made to the remaining bits at logic 0). The voltages $V_{DAC}$ and $V_{FB}$ are generated, with $V_{FB}$ compared to Vout (sampled) and the logic value of this next most significant bit set to logic 1 or 0 as a result of the comparison. This recursive process continues successively selecting bits in the register 306 until the least most significant bit is determined. At that point, the conversion time period ends and the digital signal MACout is ready for output from the ADC circuit 104.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

The invention claimed is:

1. An in-memory computation circuit, comprising:

a memory array including memory cells arranged in a matrix with plural rows and plural columns, each row including a word line connected to the memory cells of the row, and each column including a true bit line connected to the memory cells of the column and a false bit line connected to the memory cells of the column;

a word line driver circuit for each row having an output connected to drive the word line of the row;

a row controller circuit configured to simultaneously actuate the word lines by applying pulses through the word line driver circuits to the word lines in response to feature data for an in-memory compute operation; and a column processing circuit including a true first read circuit coupled to each true bit line and a false read circuit coupled to each false bit line, wherein each true read circuit comprises:

a first differential amplifier having a first input coupled to the true bit line, a second input configured to receive a reference voltage, and an output;

wherein said reference voltage is at a level greater than a write margin voltage for the memory cells where the memory cells risk inadvertent bit flip during the simultaneous actuation of the word lines for the in-memory compute operation;

a first MOS transistor having a drain coupled to the true bit line to receive a first read current and a gate coupled to the output of the first differential amplifier;

a second MOS transistor having a gate coupled to the output of the first differential amplifier and a drain configured to output a first mirrored read current; and a first integration capacitor configured to integrate the first mirrored read current to generate a first output voltage, and wherein each false read circuit comprises:

a second differential amplifier having a first input coupled to the false bit line, a second input configured to receive said reference voltage, and an output;

a third MOS transistor having a drain coupled to the false bit line to receive a second read current and a gate coupled to the output of the second differential amplifier; and a fourth MOS transistor having a gate coupled to the output of the second differential amplifier and a drain configured to output a second mirrored read current; and a second integration capacitor configured to integrate the second mirrored read current to generate a second output voltage.

2. The circuit of claim 1:

wherein the first differential amplifier and first MOS transistor function to clamp a voltage on the true bit line to said reference voltage; and wherein the second differential amplifier and third MOS transistor function to clamp a voltage on the false bit line to said reference voltage.

3. The circuit of claim 1, wherein said column processing circuit further comprises an analog-to-digital converter (ADC) circuit configured to convert a difference between the first and second output voltages to a digital output.

4. The circuit of claim 1, further comprising a switch coupled in series with each of the second and fourth MOS transistors, wherein said switch is actuated by an integration control signal to control integration of the first and second mirrored read currents by the first and second integration capacitors, respectively, during the in-memory compute operation.

5. The circuit of claim 1, wherein said first and second integration capacitors are discharged in response to assertion of a reset control signal at a beginning of the in-memory compute operation.

6. The circuit of claim 1, wherein the word line driver circuit is powered by an adaptive supply voltage, and further comprising:

a voltage generator circuit configured to generate the adaptive supply voltage for powering the word line driver circuits during the simultaneous actuation of the word lines for the in-memory compute operation, said adaptive supply voltage having a level which is dependent on integrated circuit process and/or temperature conditions.

7. The circuit of claim 6, wherein the voltage generator circuit comprises:

a current source configured to generate a current applied to a first node; and a series connection of a first transistor and second transistor between the first node and a reference node;

wherein the adaptive supply voltage is generated at said first node;

wherein the first transistor is a replica of a passgate transistor within the memory cell; and wherein the second transistor is a replica of a pull down transistor within the memory cell.

8. The circuit of claim 7, wherein:

the current generated by the current source has a magnitude set as a function of a reference current representative of current flowing through the passgate transistor and the pull down transistor for an applicable integrated circuit process corner;

the magnitude of the current generated by the current source is scaled by a factor applied to the reference current;

the first transistor is scaled by said factor for the replica of the passgate transistor; and the second transistor is scaled by said factor for the replica of the pull down transistor.

9. The circuit of claim 8, wherein said column processing circuit further comprises a successive approximation register (SAR) type analog-to-digital converter (ADC) circuit configured to convert the first output voltage to a digital output, said SAR type ADC circuit including a feedback current digital-to-analog converter (DAC) circuit having selectively actuated current sources referenced to said reference current.

10. The circuit of claim 7, further comprising an amplifier circuit having an input coupled to said first node and an output coupled to power the word line driver circuits.

11. The circuit of claim 7, wherein the current source is controlled to generate an adjustment to the current, and further comprising a control circuit configured to generate a control signal for application to the current source for modulating a level of the current away from a nominal level in response to an applicable integrated circuit process corner for transistor devices of the memory cells.

12. The circuit of claim 11, wherein the applicable integrated circuit process corner is indicated by a programmed code stored in the control circuit.

13. The circuit of claim 12, wherein the control circuit includes a lookup table (LUT) correlating the programmed code to a value of the control signal.

14. The circuit of claim 11, wherein the control circuit further comprises a temperature sensor, and wherein the control signal is configured to cause a temperature dependent tuning of the level of the current set in response to the applicable integrated circuit process corner.

15. The circuit of claim 14, wherein the control circuit includes a lookup table (LUT) correlating a sensed integrated circuit temperature to a tuning level for the value of the control signal.

16. The circuit of claim 1, wherein each memory cell is a 6T SRAM cell.

*     *     *     *     *